US010997553B2

(12) United States Patent
McLinden et al.

(10) Patent No.: US 10,997,553 B2
(45) Date of Patent: May 4, 2021

(54) METHOD AND SYSTEM FOR AUTOMATICALLY CREATING A BILL OF MATERIALS

(71) Applicant: DIGIBILT, Inc., Skokie, IL (US)

(72) Inventors: John H. McLinden, Libertyville, IL (US); Christian A. Chapel, Skokie, IL (US)

(73) Assignee: DIGIBILT, Inc., Skokie, IL (US)

( * ) Notice: Subject to any disclaimer, the term of this patent is extended or adjusted under 35 U.S.C. 154(b) by 147 days.

(21) Appl. No.: 16/173,630

(22) Filed: Oct. 29, 2018

(65) Prior Publication Data
US 2020/0134560 A1 Apr. 30, 2020

(51) Int. Cl.
*G06Q 10/08* (2012.01)
*G06Q 50/08* (2012.01)
(Continued)

(52) U.S. Cl.
CPC ......... *G06Q 10/0875* (2013.01); *G06F 30/13* (2020.01); *G06Q 50/08* (2013.01); *G06T 17/05* (2013.01)

(58) Field of Classification Search
CPC .... G06Q 10/0875; G06Q 50/08; G06F 30/13; G06T 17/05

(Continued)

(56) References Cited

U.S. PATENT DOCUMENTS 4,181,954 A   1/1980 Rosenthal et al.
4,700,318 A  10/1987 Ockman
(Continued)

FOREIGN PATENT DOCUMENTS

CN   204028926 U   12/2014
WO   WO2011051639   5/2011
(Continued)

OTHER PUBLICATIONS

Nov. 23, 2015, PCT/US2015/047,229—Partial PCT International Search Report (1 page) Anguerlis Technologies, LLC—Glunz, et al.
(Continued)

*Primary Examiner* — Vanel Frenel
(74) *Attorney, Agent, or Firm* — Lesavich High-Tech Law Group, S.C.; Stephen Lesavich

(57) ABSTRACT

A method and system for automatically creating Bills of Materials. A Building Information Model (BIM) electronic drawing is created on a 3D BIM program using Bill of Material standards. The BIM electronic drawing is exported, filtered and stored into a database with a cloud Software as a Service (SaaS) service on a cloud communications network The data is analyzed to produce in real-time a Bill of Materials accurate down to an individual piece level (e.g., stud, board, pipe, duct, etc.) for desired physical structures (e.g., houses, townhomes, multi-unit housing, etc.). The Bill of Materials includes a report produced in a standard and repeatable format, thereby reducing risk, reducing costs and ensuring a trackable level of quality for the builders of the desired physical structure and eliminating any need for estimating of any quantity, cost, installation time, installation cost or waste factor for any one of the plural physical components used to build the desired physical structure.

20 Claims, 13 Drawing Sheets

(51) Int. Cl.
*G06T 17/05* (2011.01)
*G06F 30/13* (2020.01)

(58) Field of Classification Search
USPC ............... 705/29, 500, 342, 7.23; 703/1, 6;
345/419, 420; 700/98; 726/4, 5;
707/695
See application file for complete search history.

(56) References Cited

U.S. PATENT DOCUMENTS

| | | | |
|---|---|---|---|
| 4,782,448 | A | 11/1988 | Milstein |
| 5,189,606 | A | 2/1993 | Burns et al. |
| 5,689,705 | A | 11/1997 | Fino et al. |
| 5,918,219 | A | 6/1999 | Isherwood |
| 5,920,849 | A | 7/1999 | Broughton et al. |
| 5,950,206 | A | 9/1999 | Krause |
| 6,014,503 | A | 1/2000 | Nagata et al. |
| 6,038,547 | A | 3/2000 | Casto |
| 6,421,586 | B1 | 7/2002 | Nicotera |
| 6,604,124 | B1 | 8/2003 | Archbold |
| 6,842,760 | B1 | 1/2005 | Dorgan et al. |
| 7,031,930 | B2 | 4/2006 | Freeman et al. |
| 7,089,203 | B1 | 8/2006 | Crookshanks |
| 7,295,955 | B2 | 11/2007 | Sit |
| 7,349,863 | B1 | 3/2008 | Pena-Mora et al. |
| 7,529,650 | B2 | 5/2009 | Wakelam et al. |
| 7,720,703 | B1 | 5/2010 | Boughton |
| 7,949,690 | B2 | 5/2011 | McArdle et al. |
| 8,065,123 | B2 | 11/2011 | Wood |
| 8,255,358 | B2 | 8/2012 | Ballew et al. |
| 8,306,836 | B2 | 11/2012 | Nichols et al. |
| 8,427,473 | B2 | 4/2013 | Elsberg et al. |
| 8,463,765 | B2 | 6/2013 | Lesavich |
| 8,484,231 | B2 | 7/2013 | Li et al. |
| 8,558,658 | B2 | 10/2013 | Kumar et al. |
| 8,606,554 | B2 | 12/2013 | Zimmermann et al. |
| 8,666,936 | B2 | 3/2014 | Wallace |
| 8,793,790 | B2 | 7/2014 | Khurana et al. |
| 9,037,564 | B2 | 5/2015 | Lesavich et al. |
| 9,137,250 | B2 | 9/2015 | Lesavich et al. |
| 9,208,264 | B2 | 12/2015 | Wood |
| 9,361,479 | B2 | 6/2016 | Lesavich et al. |
| 9,569,771 | B2 | 2/2017 | Lesavich et al. |
| 9,720,703 | B2 | 8/2017 | Reick et al. |
| 9,782,936 | B2 | 10/2017 | Glunz et al. |
| 9,817,922 | B2 | 11/2017 | Glunz et al. |
| 9,875,458 | B2 | 1/2018 | Iyer |
| 10,867,282 | B2 | 12/2020 | Glunz |
| 2002/0026343 | A1 | 2/2002 | Duenke |
| 2004/0059539 | A1 | 3/2004 | Otsuki et al. |
| 2004/0073410 | A1* | 4/2004 | Maly ............ G06F 30/13 703/1 |
| 2005/0071135 | A1* | 3/2005 | Vredenburgh ......... G06T 19/00 703/1 |
| 2005/0081161 | A1 | 4/2005 | Macinnes |
| 2006/0015475 | A1 | 1/2006 | Birkner et al. |
| 2006/0136179 | A1 | 6/2006 | Sit |
| 2008/0059220 | A1 | 3/2008 | Roth et al. |
| 2008/0249756 | A1 | 10/2008 | Chaisuparasmikul |
| 2008/0281573 | A1 | 11/2008 | Seletsky et al. |
| 2009/0070182 | A1 | 3/2009 | Eder |
| 2009/0125283 | A1 | 5/2009 | Conover |
| 2009/0292509 | A1 | 11/2009 | Thompson et al. |
| 2010/0070241 | A1 | 3/2010 | Opdahl et al. |
| 2010/0110071 | A1 | 5/2010 | Elsberg et al. |
| 2010/0280836 | A1 | 11/2010 | Lu et al. |
| 2011/0054652 | A1 | 3/2011 | Heil |
| 2011/0071805 | A1 | 3/2011 | Pendyala et al. |
| 2011/0093424 | A1 | 4/2011 | Zimmermann et al. |
| 2011/0133884 | A1 | 6/2011 | Kumar et al. |
| 2011/0208710 | A1 | 8/2011 | Lesavich et al. |
| 2011/0218777 | A1 | 9/2011 | Chen et al. |
| 2011/0285851 | A1 | 11/2011 | Plocher et al. |
| 2011/0307281 | A1 | 12/2011 | Creveling |
| 2012/0203806 | A1 | 8/2012 | Panushev |
| 2012/0215500 | A1 | 8/2012 | Ciuti et al. |
| 2012/0265707 | A1 | 10/2012 | Bushnell |
| 2012/0278622 | A1 | 11/2012 | Lesavich et al. |
| 2012/0284596 | A1 | 11/2012 | Bushnell et al. |
| 2012/0296609 | A1 | 11/2012 | Khan et al. |
| 2012/0296610 | A1 | 11/2012 | Hailemariam et al. |
| 2012/0310906 | A1 | 12/2012 | Miller et al. |
| 2013/0013265 | A1 | 1/2013 | Narayan et al. |
| 2013/0082101 | A1 | 4/2013 | Omansky et al. |
| 2013/0091539 | A1 | 4/2013 | Khurana et al. |
| 2013/0125029 | A1 | 5/2013 | Trimbl |
| 2013/0144746 | A1 | 6/2013 | Phung |
| 2013/0155058 | A1 | 6/2013 | Golparvar-Fard |
| 2013/0179207 | A1 | 7/2013 | Perez Rodriguez |
| 2013/0182103 | A1 | 7/2013 | Lee et al. |
| 2013/0185024 | A1 | 7/2013 | Mahasenan et al. |
| 2013/0235029 | A1 | 9/2013 | Keough et al. |
| 2013/0257850 | A1 | 10/2013 | Chen et al. |
| 2013/0303193 | A1 | 11/2013 | Dharwada et al. |
| 2013/0307682 | A1 | 11/2013 | Jerhotova et al. |
| 2013/0314210 | A1 | 11/2013 | Schoner et al. |
| 2013/0314232 | A1 | 11/2013 | Jerhotova et al. |
| 2013/0335413 | A1 | 12/2013 | Wang et al. |
| 2014/0039845 | A1 | 2/2014 | Saban et al. |
| 2014/0089209 | A1 | 3/2014 | Akcamete et al. |
| 2014/0189792 | A1 | 7/2014 | Lesavich et al. |
| 2014/0192159 | A1 | 7/2014 | Chen et al. |
| 2014/0207774 | A1 | 7/2014 | Walter et al. |
| 2014/0214215 | A1 | 7/2014 | Han et al. |
| 2014/0229212 | A1 | 8/2014 | MacElheron |
| 2014/0304107 | A1 | 10/2014 | Clarke |
| 2014/0358617 | A1 | 12/2014 | LePage |
| 2015/0188927 | A1* | 7/2015 | Santhi ............... H04L 67/1002 726/4 |
| 2015/0228003 | A1* | 8/2015 | Iyoob ............... H04L 67/16 705/26.64 |
| 2015/0248503 | A1 | 9/2015 | Glunz et al. |
| 2015/0248504 | A1 | 9/2015 | Glunz et al. |
| 2015/0379301 | A1 | 12/2015 | Lesavich et al. |
| 2016/0321654 | A1 | 11/2016 | Lesavich et al. |
| 2017/0132567 | A1 | 5/2017 | Glunz et al. |
| 2017/0132568 | A1 | 5/2017 | Glunz et al. |
| 2019/0205484 | A1 | 7/2019 | Morkos |
| 2019/0294018 | A1* | 9/2019 | Shrivastava ............... E06B 9/24 |
| 2020/0134560 | A1 | 4/2020 | McLinden et al. |
| 2020/0134745 | A1 | 4/2020 | McLinden et al. |
| 2020/0380080 | A1 | 12/2020 | Glunz |

FOREIGN PATENT DOCUMENTS

WO WO2014/111587 7/2014
WO PCT/US2015/047229 8/2015

OTHER PUBLICATIONS

BimObject Apps—Malmo, Sweden—https://info.bimobject.com/bimobject-apps.

* cited by examiner

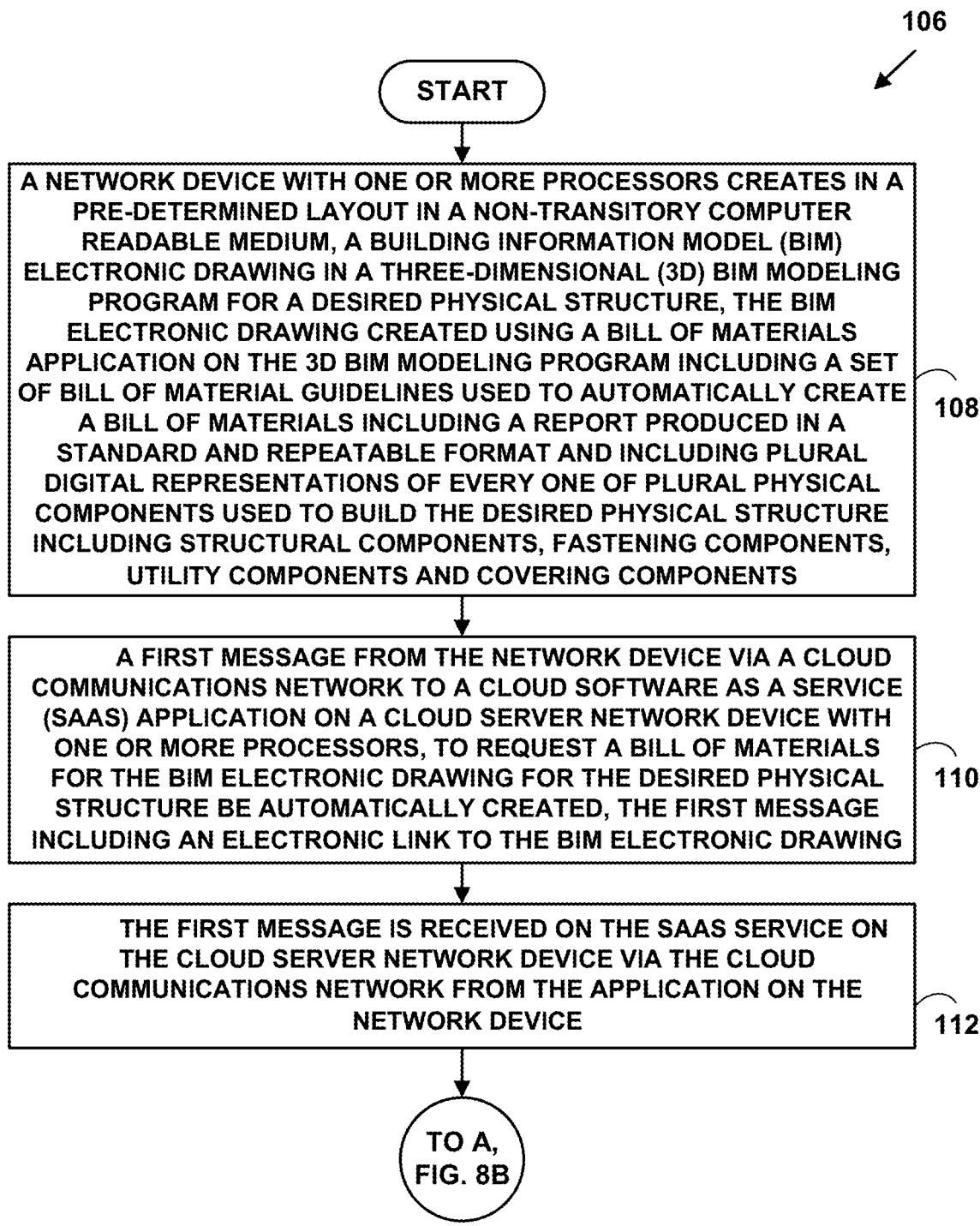

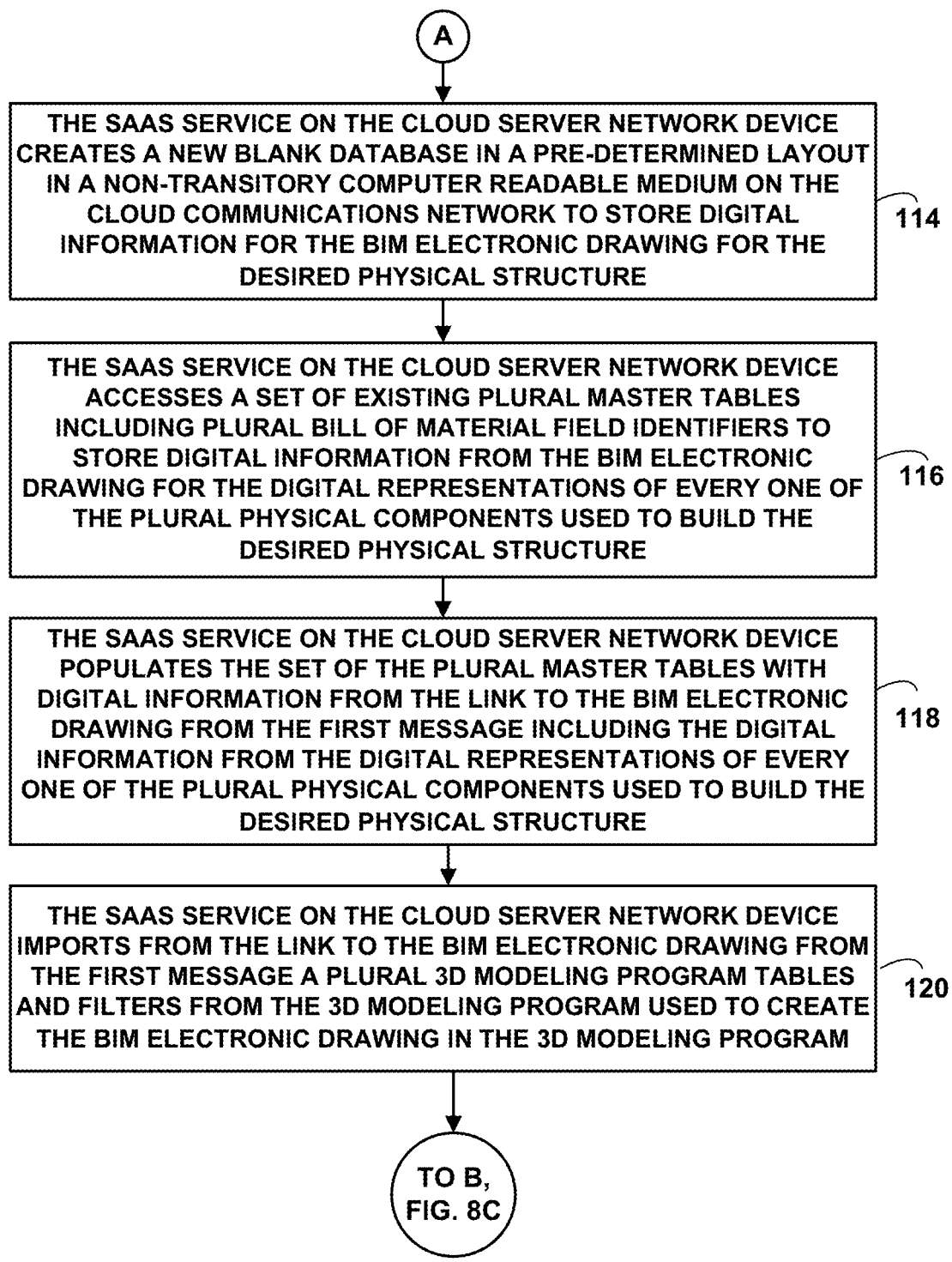

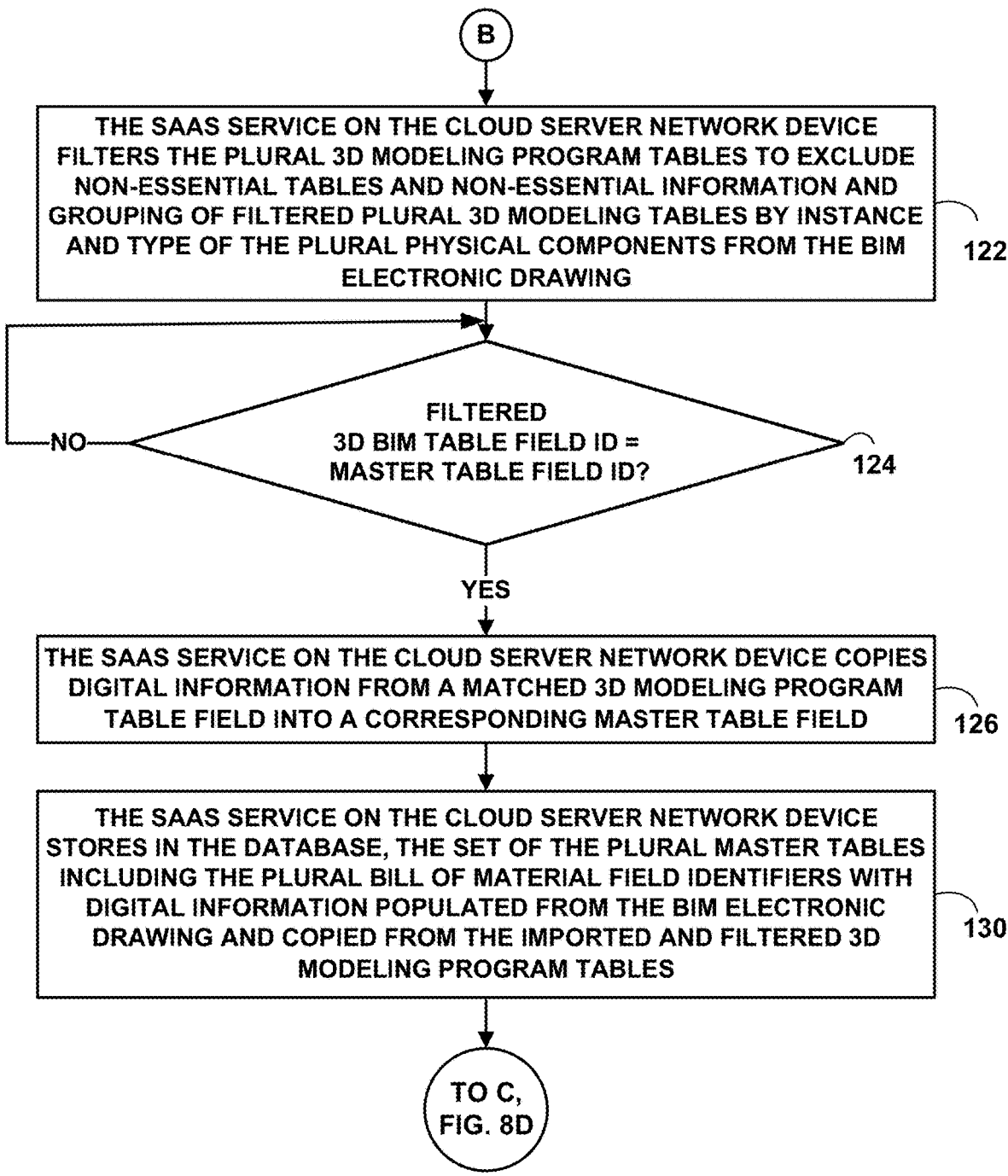

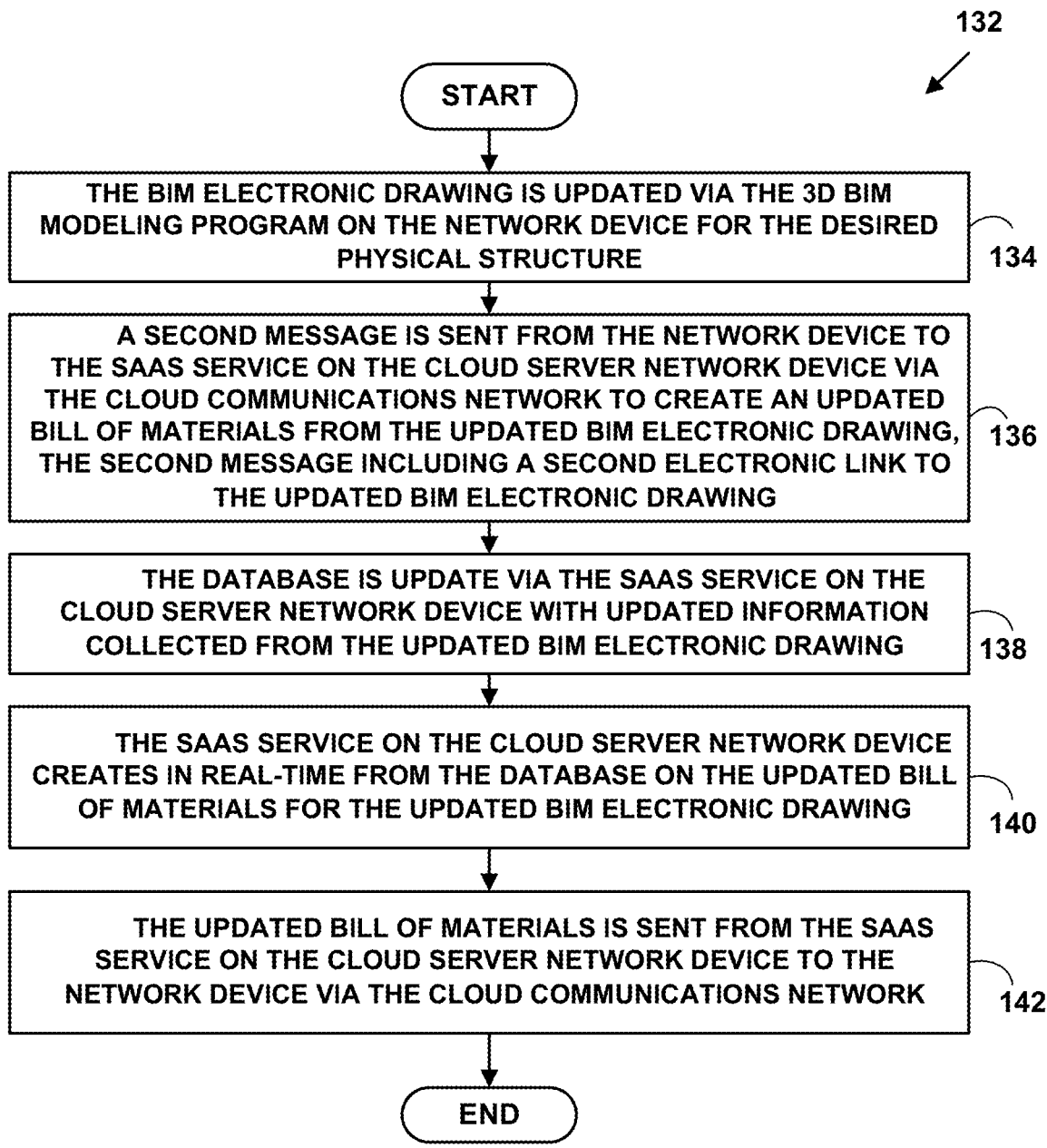

METHOD AND SYSTEM FOR AUTOMATICALLY CREATING A BILL OF MATERIALS

CROSS REFERENCES TO RELATED APPLICATIONS

None.

FIELD OF INVENTION

This application relates to bills of materials for the construction industry. More specifically, it relates to a method and system for automatically creating a bill or materials.

BACKGROUND OF THE INVENTION

Building information modeling (BIM) is a process involving the generation and management of digital representations of physical and functional characteristics of physical entities such as buildings, infrastructure components, etc. Building information models (BIMs) are digital files which can be created, extracted, exchanged or networked to support decision-making regarding a building or other physical asset. Current BIM software is used by individuals, businesses and government agencies who plan, design, construct, operate and maintain diverse physical infrastructures, such as water, refuse, electricity, gas, communication utilities, roads, bridges, ports, tunnels, buildings, homes, etc.

A Bill of Materials is a list of materials required by a contractor to complete a contract, or by a supplier or vendor to complete an order. A Bill of Materials typically includes list of all raw materials, parts, intermediates, subassemblies, etc., (with their quantities and description) required to construct, overhaul, or repair something.

Typically, a Bill of Materials is created with a manual process after a contractor or subcontractor receives a set of drawings, either digital or hard copy, then manually counts the quantities for each material type assisted by either a digitizer or set of colored pencils to help keep track along the way.

There are several problems associate with manually creating a Bill of Materials. One problem is that according to a study by McKinsey Global Institute in 2017, since the late 1980s, digital technology has improved most business operations. However, the construction industry has not yet readily adopted digitalization, and remains the second lowest industry on the McKinsey Global Institute industry digitalization index. This results in higher costs, missed deadlines, waste and other problems.

Another problem is that the typical method for estimating quantities and producing a Bill of Materials is inconvenient in that counts and measurements must be made manually (even with the assistance of a digitizer which requires the selection of a start and/or end point) and thus requires a significant amount of time even though the materials were already carefully drawn by an architect or engineer. Another problem is that no Bill of Materials are created down to an individual piece level (e.g., stud, pipe, duct, etc.). Another problem is that there is current no standard for what a Bill of Materials should include or look like.

Another problem is that architects and engineers are not being compensated to draw at a piece level. Even if they did, it would be a digital dead end without an application to utilize that data and the benefits would be limited.

Another problem is that, the methods used to create Bills of Materials known in the art have the weakness of manual error, resulting in the subcontractor who has missed quantities on the drawings winning the bid for the work. Another problem is applying human judgement on items such as waste factors for a Bills of Materials where there are no standards to follow.

Another problem is that if a subcontractor or material supplier has manually calculated quantities for a bid and only receives a moderate percentage of that work, their time has been wasted on the bidding process.

There have been some attempts to solve some of the problems associated with creating Bills of Materials.

For example U.S. Pat. No. 9,875,458, that issued to Iyer teaches "An apparatus for tracking a plurality of built components is provided. The apparatus comprises a reading gate configured to identify at least one fabricated building component arrived at the point of entry of the building site by reading an ID tag of each fabricated building component arrived at the point of entry of the building site and by associating the ID tag with a number imprinted on each fabricated building component. The reading gate is configured to record the timing of arrival of the identified fabricated building component at the point of entry of the building site."

U.S. Pat. No. 7,720,703, that issued to Boughton teaches "System and methods are described for assisting a contractor in managing information associated with a construction project. The amount of information relating to labor, materials, scheduling and billing and the number of individuals accessing the information can be overwhelmingly large for even a simple construction project. As such, the system and methods described are particularly useful for gathering, maintaining and disseminating the voluminous amount of information associated with a construction project. In one method, a drawing from a construction project is provided that has one or more intelligent objects. Information is then gathered relating to labor, materials and schedules for the project. The information is associated with the respective intelligent object and visually represented on the drawing. The drawing is displayed and certain aspects associated with the intelligent objects can be quickly identified. In addition, reports may be generated that quickly and efficiently organize information according to any number of user selected criteria."

U.S. Published Patent Application 20140358617 published by Lepage describes "The present document describes a method for producing a construction plan, a corresponding list of materials and a corresponding cost estimate. The method comprises, at a computing device, receiving a selection of a type of construction project characterized by a predefined set of variables, an initial construction plan, a corresponding initial list of materials and a corresponding initial cost estimate. The method further comprises receiving a modification of at least one of the variables; and producing: an updated construction plan based on the variables; a corresponding updated list of materials based on the variables and on a list of unit materials; and a corresponding updated cost estimate based on the updated list of materials and on a list of unit prices for the list of unit materials."

BIMobject, a company in Sweden, has created a product that teaches "allowing BIM users to create Bill of Materials, tenders, bids and direct orders seamlessly within a BIM project in Autodesk Revit. The solution will allow for cloud-based sharing of the lists of products and materials with Building Product Manufacturers (BPMs) in order to get pricing, quotes or to place direct orders."

However, these solutions still do not solve all of the problems associated with creating Bills of Materials. Thus, it is desirable to solve some of the problems associated with creating Bills of Materials.

SUMMARY OF THE INVENTION

In accordance with preferred embodiments of the present invention, some of the problems associated with creating Bills of Materials are overcome. A method and system for automatically creating Bills of Materials is presented.

A Building Information Model (BIM) electronic drawing is created on a 3D BIM program using Bill of Material standards. The BIM electronic drawing is exported, filtered and stored into a database with a cloud Software as a Service (SaaS) service on a cloud communications network. The BIM electronic drawing data is analyzed to produce in real-time a Bill of Materials accurate down to an individual piece level (e.g., stud, board, pipe, duct, etc.) for desired physical structures (e.g., houses, townhomes, multi-unit housing, commercial structures etc.). There is also the ability to add items to the Bill of Materials which are not drawn in BIM, such as adhesives, nails, bolts, paint, etc. The Bill of Materials includes a report produced in a standard and repeatable format with a calculated quantity, purchase cost, installation time, installation cost and waste factor for every one of the plural physical components used to build the desired physical structure. This is accomplished by a calculation utilizing parameters from the BIM objects. The Bill of Materials report thereby reducing risk, reducing costs and ensuring a trackable level of quality for the builders of the desired physical structure and thereby eliminating any need for estimating of any quantity, cost, installation time, installation cost or waste factor for any one of the plural physical components used to build the desired physical structure.

The foregoing and other features and advantages of preferred embodiments of the present invention will be more readily apparent from the following detailed description. The detailed description proceeds with references to the accompanying drawings.

BRIEF DESCRIPTION OF THE DRAWINGS

Preferred embodiments of the present invention are described with reference to the following drawings, wherein:

FIGS. 8A, 8B, 8C and 8D are a flow diagram illustrating a method for automatic real-time creation of a Bill of Materials;

FIG. 9 is a flow diagram illustrating a method for automatic real-time creation of a Bill of Materials.

DETAILED DESCRIPTION OF PREFERRED EMBODIMENTS

Exemplary Bill of Materials Creation System

Figure 1:
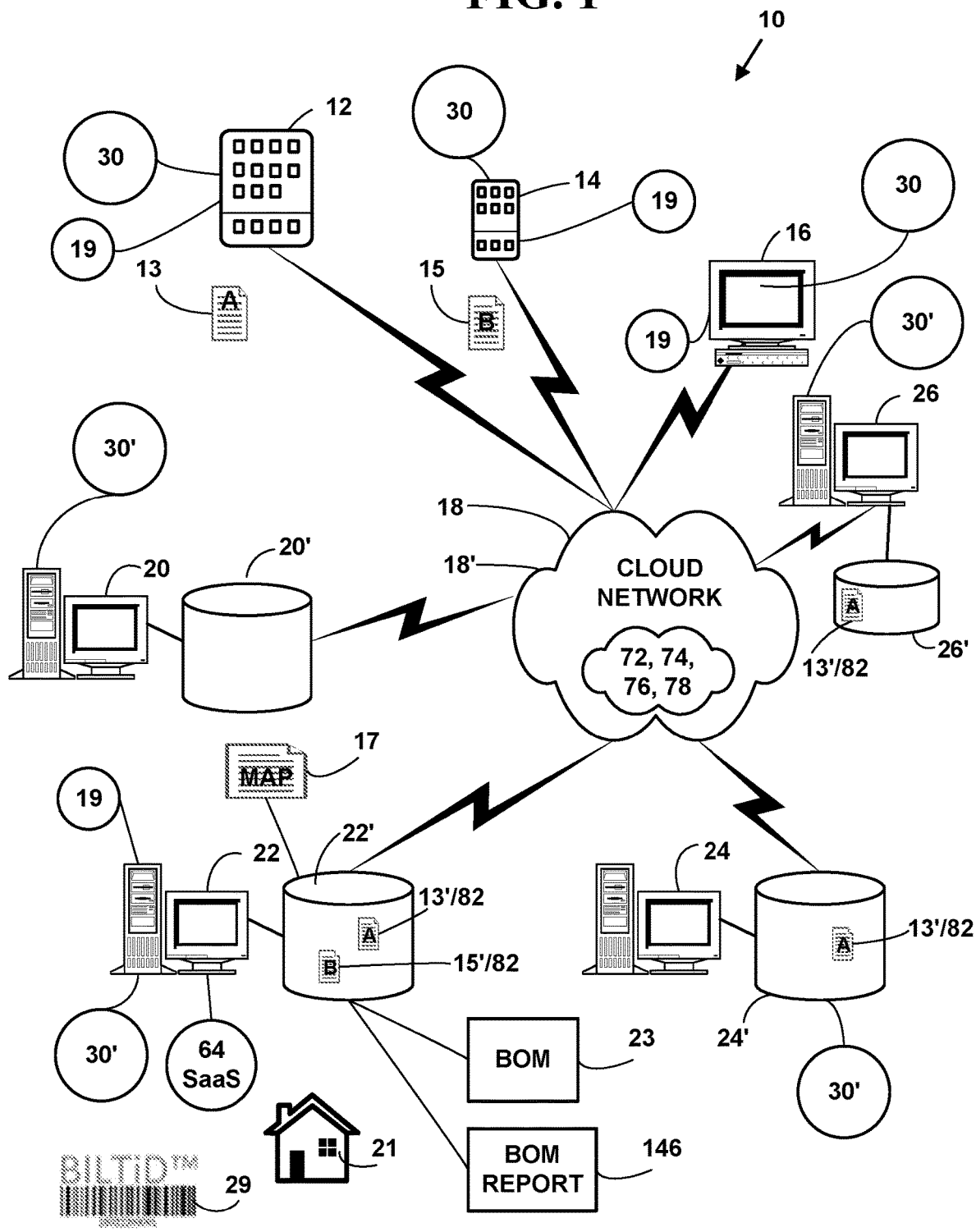
FIG. 1 is a block diagram illustrating an exemplary electronic building information processing system.

FIG. 1 is a block diagram illustrating an exemplary electronic bill of materials creation system 10. The exemplary electronic system 10 includes, but is not limited to, one or more target network devices 12, 14, 16 (only three of which are illustrated) each with one or more processors and each with a non-transitory computer readable medium.

The one or more target network devices 12, 14, 16 include, but are not limited to, multimedia capable desktop and laptop computers, tablet computers, mobile phones, non-mobile phones with and/or without displays, smart phones, Internet phones, Internet appliances, personal digital/data assistants (PDA), digital cameras, portable game consoles (Play Station Portable by Sony, Game Boy by Sony, Nintendo DSI, etc.), non-portable game consoles (Xbox by Microsoft, Play Station by Sony, Wii by Nintendo, etc.), cable television (CATV), satellite television (SATV) and Internet television set-top boxes, digital televisions including high definition television (HDTV), three-dimensional (3DTV) televisions, wearable devices and other types of network devices.

The one or more target network devices 12, 14, 16 include smart phones such as the iPhone by Apple, Inc., Blackberry Storm and other Blackberry models by Research In Motion, Inc. (RIM), Droid by Motorola, Inc. HTC, Inc. other types of smart phones, etc. However, the present invention is not limited to such smart phone devices, and more, fewer or other devices can be used to practice the invention.

A "smart phone" is a mobile phone that offers more advanced computing ability and connectivity than a contemporary basic feature phone. Smart phones and feature phones may be thought of as handheld computers integrated with a mobile telephone, but while most feature phones are able to run applications based on platforms such as Java ME, a smart phone usually allows the user to install and run more advanced applications. Smart phones and/or tablet computers run complete operating system software providing a platform for application developers.

The operating systems include the iPhone OS, Android, Windows, etc. iPhone OS is a proprietary operating system for the Apple iPhone. Android is an open source operating system platform backed by Google, along with major hardware and software developers (such as Intel, HTC, ARM, Motorola and Samsung, etc.), that form the Open Handset Alliance.

The one or more target network devices 12, 14, 16, also include tablet computers such as the iPad, by Apple, Inc., the HP Tablet, by Hewlett Packard, Inc., the Playbook, by RIM, Inc., the Tablet, by Sony, Inc.

The target network devices 12, 14, 16 are in communications with a cloud communications network 18 and/or a non-cloud computing network 18' via one or more wired and/or wireless communications interfaces. The cloud communications network 18, is also called a "cloud computing network" herein and the terms may be used interchangeably.

The target network devices 12, 14, 16 creates and/or requests desired electronic content such as 3D models, 3D BIM drawings 13, 15, Bill of Materials 23, etc. and data for specific 3D modeling programs stored on the cloud communications network 18 or non-cloud communications network 18'.

In one embodiment, the BIM electronic drawing 13, 15 is created in a 3D BIM modeling program 19 for a desired physical structure 21, the BIM electronic drawing 13, 15 created using a Bill of Materials application 30 on the 3D BIM modeling program 19 including a set of Bill of Material guidelines used to automatically create a Bill of Materials 23 including a report 146 produced in a standard and repeatable format and including a plural digital representations plural physical components used to build a desired physical structure 21 at an individual piece level (e.g., stud, board, pipe, duct, etc.). However, the present invention is not limited to such an embodiment and other embodiments can be used to practice the invention.

The cloud communications network 18 and non-cloud communications network 18' includes, but is not limited to, communications over a wire connected to the target network devices, wireless communications, and other types of communications using one or more communications and/or networking protocols.

Plural server network devices 20, 22, 24, 26 (only four of which are illustrated) each with one or more processors and a non-transitory computer readable medium include one or more associated databases 20', 22', 24', 26'. The plural network devices 20, 22, 24, 26 are in communications with the one or more target devices 12, 14, 16 via the cloud communications network 18 and non-cloud communications network 18'.

Plural server network devices 20, 22, 24, 26 (only four of which are illustrated) are physically located on one more public networks 76 (See FIG. 4), private networks 72, community networks 74 and/or hybrid networks 78 comprising the cloud network 18.

One or more server network devices (e.g., 20, etc.) securely stores one or more cloud content location maps 17 and other plural server network devices (e.g., 22, 24, 26, etc.) store portions 13', 15' of desired electronic content 13,13' 15,15' as cloud storage objects 82 (FIG. 5) as is described herein.

The plural server network devices 20, 22, 24 26, include, but are not limited to, World Wide Web servers, Internet servers, search engine servers, vertical search engine servers, social networking site servers, file servers, other types of electronic information servers, and other types of server network devices (e.g., edge servers, firewalls, routers, gateways, etc.).

The plural server network devices 20, 22, 24, 26 also include, but are not limited to, network servers used for cloud computing providers, etc.

The cloud communications network 18 and non-cloud communications network 18' includes, but is not limited to, a wired and/or wireless communications network comprising one or more portions of: the Internet, an intranet, a Local Area Network (LAN), a wireless LAN (WiLAN), a Wide Area Network (WAN), a Metropolitan Area Network (MAN), a Public Switched Telephone Network (PSTN), a Wireless Personal Area Network (WPAN) and other types of wired and/or wireless communications networks 18.

The cloud communications network 18 and non-cloud communications network 18' includes one or more gateways, routers, bridges and/or switches. A gateway connects computer networks using different network protocols and/or operating at different transmission capacities. A router receives transmitted messages and forwards them to their correct destinations over the most efficient available route. A bridge is a device that connects networks using the same communications protocols so that information can be passed from one network device to another. A switch is a device that filters and forwards packets between network segments based on some pre-determined sequence (e.g., timing, sequence number, etc.).

An operating environment for the network devices of the exemplary electronic information display system 10 include a processing system with one or more high speed Central Processing Unit(s) (CPU), processors, one or more memories and/or other types of non-transitory computer readable mediums. In accordance with the practices of persons skilled in the art of computer programming, the present invention is described below with reference to acts and symbolic representations of operations or instructions that are performed by the processing system, unless indicated otherwise. Such acts and operations or instructions are referred to as being "computer-executed," "CPU-executed," or "processor-executed."

It will be appreciated that acts and symbolically represented operations or instructions include the manipulation of electrical information by the CPU or processor. An electrical system represents data bits which cause a resulting transformation or reduction of the electrical information or biological information, and the maintenance of data bits at memory locations in a memory system to thereby reconfigure or otherwise alter the CPU's or processor's operation, as well as other processing of information. The memory locations where data bits are maintained are physical locations that have particular electrical, magnetic, optical, or organic properties corresponding to the data bits.

The data bits may also be maintained on a non-transitory computer readable medium including magnetic disks, optical disks, organic memory, and any other volatile (e.g., Random Access Memory (RAM)) or non-volatile (e.g., Read-Only Memory (ROM), flash memory, etc.) mass storage system readable by the CPU. The non-transitory computer readable medium includes cooperating or interconnected computer readable medium, which exist exclusively on the processing system or can be distributed among multiple interconnected processing systems that may be local or remote to the processing system.

Exemplary Electronic Bill of Materials Display System

Figure 2:
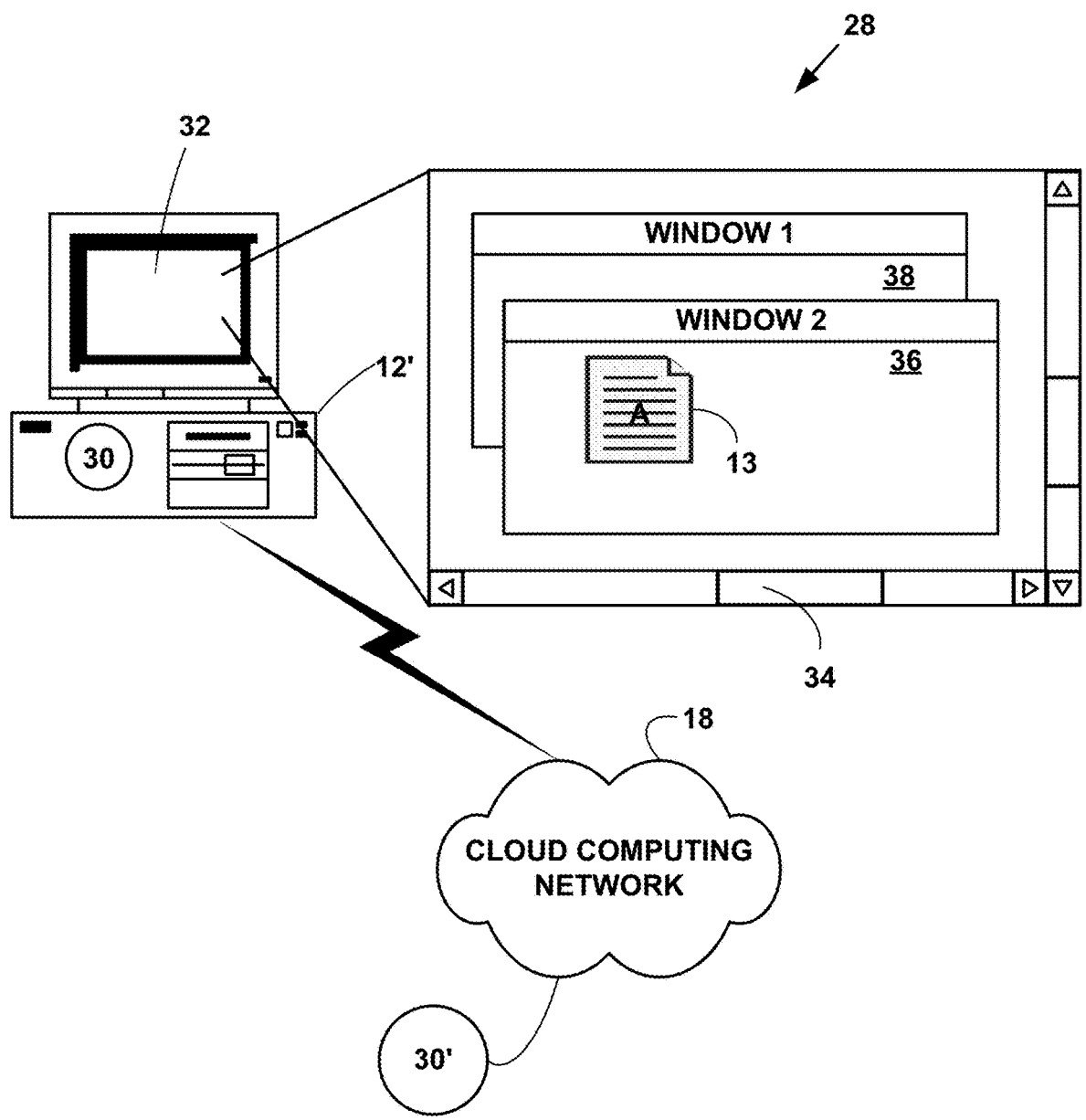
FIG. 2 is a block diagram illustrating an exemplary electronic building information processing system display.

FIG. 2 is a block diagram illustrating an exemplary electronic building information display system 28. The exemplary display system 28 includes, but is not limited to a target network device (e.g., 12, etc.) with an application 30 and a display component 32. The application 30 presents a graphical user interface (GUI) 34 on the display 32 component. The GUI 32 presents a multi-window 36, 38, etc. (only two of which are illustrated) interface to a user.

In one embodiment of the invention, the application 30 is a software application. However, the present invention is not limited to this embodiment and the application 30 can be hardware, firmware, hardware and/or any combination thereof. In one embodiment, the application 30 is a mobile application for a smart phone, electronic tablet or other mobile network device. In another embodiment, the application 30, 30' is cloud application used on a cloud communications network 18. However, the present invention is not limited these embodiments and other embodiments can be used to practice the invention In another embodiment, a portion of the application 30 is executing on the target network devices 12, 14, 16 and another portion of the application 30' is executing on the server network devices 20, 22, 24, 26. The applications also include one or more library applications. However, the present invention is not limited these embodiments and other embodiments can be used to practice the invention.

Exemplary Networking Protocol Stack

Figure 3:
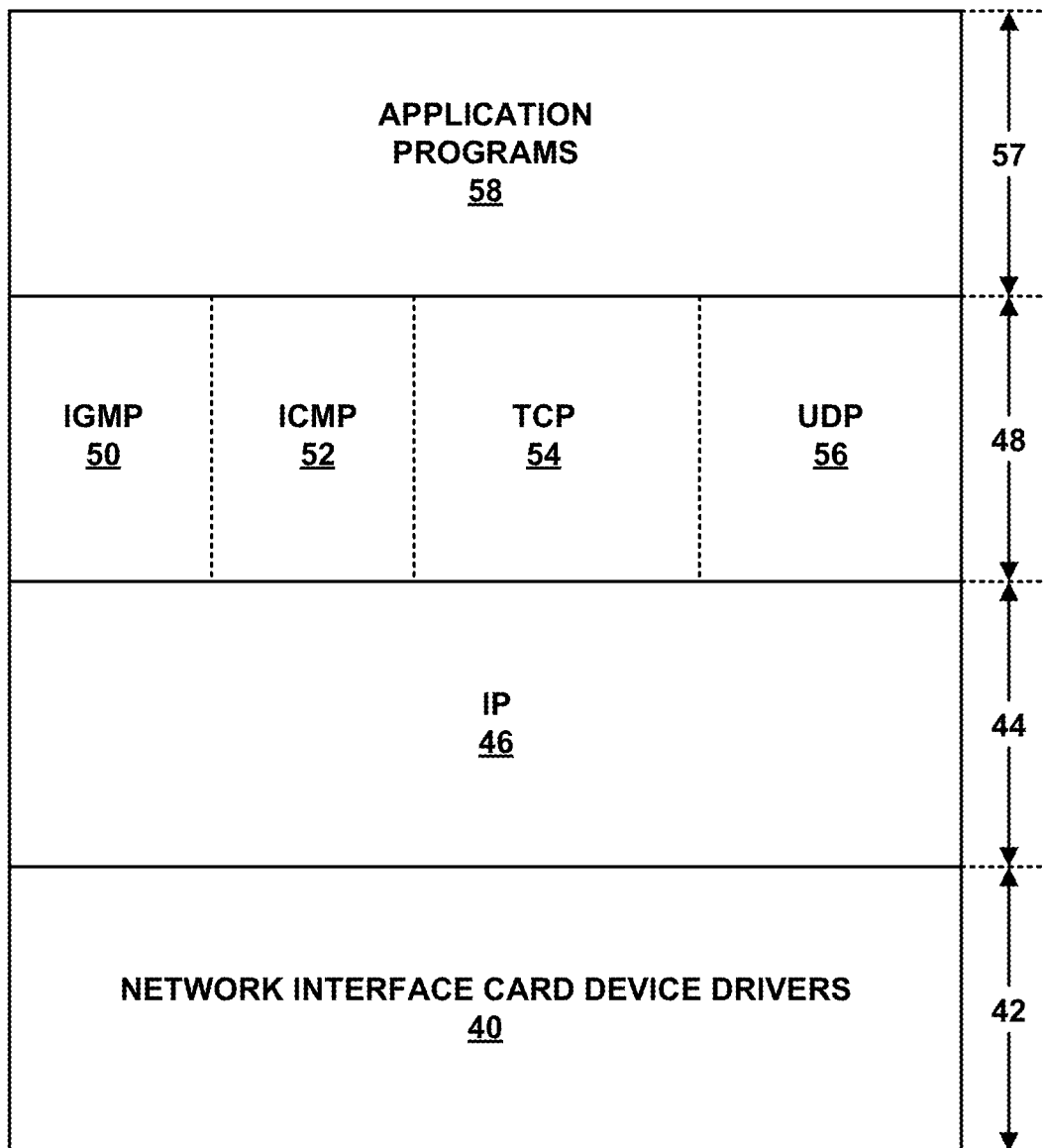
FIG. 3 is a block diagram illustrating an exemplary networking protocol stack.

FIG. 3 a block diagram illustrating a layered protocol stack 38 for network devices in the electronic information display system 10. The layered protocol stack 38 is described with respect to Internet Protocol (IP) suites comprising in general from lowest-to-highest, a link 42, network 44, transport 48 and application 57 layers. However, more or fewer layers could also be used, and different layer designations could also be used for the layers in the protocol stack 38 (e.g., layering based on the Open Systems Interconnection (OSI) model including from lowest-to-highest, a physical, data-link, network, transport, session, presentation and application layer.).

The network devices 12, 14, 16, 20, 22, 24, 26 are connected to the communication network 18 with Network Interface Card (NIC) cards including device drivers 40 in a link layer 42 for the actual hardware connecting the network devices 12, 14, 16, 20, 22, 24, 26 to the cloud communications network 18. For example, the NIC device drivers 40 may include a serial port device driver, a digital subscriber line (DSL) device driver, an Ethernet device driver, a wireless device driver, a wired device driver, etc. The device drivers interface with the actual hardware being used to connect the network devices to the cloud communications network 18. The NIC cards have a medium access control (MAC) address that is unique to each NIC and unique across the whole cloud network 18. The Medium Access Control (MAC) protocol is used to provide a data link layer of an Ethernet LAN system and for other network systems.

Above the link layer 42 is a network layer 44 (also called the Internet Layer for Internet Protocol (IP) suites). The network layer 44 includes, but is not limited to, an IP layer 46.

IP 46 is an addressing protocol designed to route traffic within a network or between networks. However, more fewer or other protocols can also be used in the network layer 44, and the present invention is not limited to IP 46. For more information on IP 46 see IETF RFC-791, incorporated herein by reference.

Above network layer 44 is a transport layer 48. The transport layer 48 includes, but is not limited to, an optional Internet Group Management Protocol (IGMP) layer 50, a Internet Control Message Protocol (ICMP) layer 52, a Transmission Control Protocol (TCP) layer 52 and a User Datagram Protocol (UDP) layer 54. However, more, fewer or other protocols could also be used in the transport layer 48.

Optional IGMP layer 50, hereinafter IGMP 50, is responsible for multicasting. For more information on IGMP 50 see RFC-1112, incorporated herein by reference. ICMP layer 52, hereinafter ICMP 52 is used for IP 46 control. The main functions of ICMP 52 include error reporting, reachability testing (e.g., pinging, etc.), route-change notification, performance, subnet addressing and other maintenance. For more information on ICMP 52 see RFC-792, incorporated herein by reference. Both IGMP 50 and ICMP 52 are not required in the protocol stack 38. ICMP 52 can be used alone without optional IGMP layer 50.

TCP layer 54, hereinafter TCP 54, provides a connection-oriented, end-to-end reliable protocol designed to fit into a layered hierarchy of protocols which support multi-network applications. TCP 54 provides for reliable inter-process communication between pairs of processes in network devices attached to distinct but interconnected networks. For more information on TCP 54 see RFC-793, incorporated herein by reference.

UDP layer 56, hereinafter UDP 56, provides a connectionless mode of communications with datagrams in an interconnected set of computer networks. UDP 54 provides a transaction oriented datagram protocol, where delivery and duplicate packet protection are not guaranteed. For more information on UDP 56 see RFC-768, incorporated herein by reference. Both TCP 54 and UDP 56 are not required in protocol stack 38. Either TCP 54 or UDP 56 can be used without the other.

Above transport layer 48 is an application layer 57 where application programs 58 (e.g., 30, 30', etc.) to carry out desired functionality for a network device reside. For example, the application programs 58 for the client network devices 12, 14, 16 may include web-browsers or other application programs, application program 30, while application programs for the server network devices 20, 22, 24, 26 may include other application programs (e.g., 30', etc.).

However, the protocol stack 38 is not limited to the protocol layers illustrated and more, fewer or other layers and protocols can also be used in protocol stack 38. In addition, other protocols from the Internet Protocol suites (e.g., Simple Mail Transfer Protocol, (SMTP), Hyper Text Transfer Protocol (HTTP), File Transfer Protocol (FTP), Dynamic Host Configuration Protocol (DHCP), DNS, etc.) and/or other protocols from other protocol suites may also be used in protocol stack 38.

In addition, markup languages such as HyperText Markup Language (HTML), EXtensible Markup Language (XML) and others are used.

HyperText Markup Language (HTML) is a markup language for creating web pages and other information that can be displayed in a web browser.

HTML is written in the form of HTML elements consisting of tags enclosed in angle brackets within the web page content. HTML tags most commonly come in pairs although some tags represent empty elements and so are unpaired. The first tag in a pair is the start tag, and the second tag is the end tag (they are also called opening tags and closing tags). In between these tags web designers can add text, further tags, comments and other types of text-based content.

The purpose of a web browser is to read HTML documents and compose them into visible or audible web pages. The browser does not display the HTML tags, but uses the tags to interpret the content of the page.

HTML elements form the building blocks of all websites. HTML allows images and objects to be embedded and can be used to create interactive forms. It provides a means to create structured documents by denoting structural semantics for text such as headings, paragraphs, lists, links, quotes and other items. It can embed scripts written in languages such as JavaScript which affect the behavior of HTML web pages.

EXtensible Markup Language (XML) is another markup language that defines a set of rules for encoding documents in a format that is both human-readable and machine-readable. It is defined in the XML 1.0 Specification produced by the W3C, the contents of which are incorporated by reference and several other related specifications, all free open standards.

XML a textual data format with strong support via Unicode for the languages of the world. Although the design of XML focuses on documents, it is widely used for the representation of arbitrary data structures, for example in web services. The oldest schema language for XML is the Document Type Definition (DTD). DTDs within XML documents define entities, which are arbitrary fragments of text and/or markup tags that the XML processor inserts in the DTD itself and in the XML document wherever they are referenced, like character escapes.

Preferred embodiments of the present invention include network devices and wired and wireless interfaces that are compliant with all or part of standards proposed by the Institute of Electrical and Electronic Engineers (IEEE), International Telecommunications Union-Telecommunication Standardization Sector (ITU), European Telecommunications Standards Institute (ETSI), Internet Engineering Task Force (IETF), U.S. National Institute of Security Technology (NIST), American National Standard Institute (ANSI), Wireless Application Protocol (WAP) Forum, Bluetooth Forum, or the ADSL Forum.

Wireless Interfaces

In one embodiment of the present invention, the wireless interfaces on network devices 12, 14, 16, 20, 22, 24, 26 include but are not limited to, 3G and/or 4G IEEE 802.11a, 802.11b, 802.11g, 802.11n, 802.15.4 (ZigBee), "Wireless Fidelity" (Wi-Fi), "Worldwide Interoperability for Microwave Access" (WiMAX), ETSI High Performance Radio Metropolitan Area Network (HIPERMAN) or "RF Home" wireless interfaces. In another embodiment of the present invention, the wireless sensor device may include an integral or separate Bluetooth and/or infra data association (IrDA) module for wireless Bluetooth or wireless infrared communications. However, the present invention is not limited to such an embodiment and other 802.11xx and other types of wireless interfaces can also be used.

802.11b is a short-range wireless network standard. The IEEE 802.11b standard defines wireless interfaces that provide up to 11 Mbps wireless data transmission to and from wireless devices over short ranges. 802.11a is an extension of the 802.11b and can deliver speeds up to 54M bps. 802.11g deliver speeds on par with 802.11a. However, other 802.11XX interfaces can also be used and the present invention is not limited to the 802.11 protocols defined. The IEEE 802.11a, 802.11b and 802.11g standards are incorporated herein by reference.

Wi-Fi is a type of 802.11XX interface, whether 802.11b, 802.11a, dual-band, etc. Wi-Fi devices include an RF interfaces such as 2.4 GHz for 802.11b or 802.11g and 5 GHz for 802.11a.

802.15.4 (Zigbee) is low data rate network standard used for mesh network devices such as sensors, interactive toys, smart badges, remote controls, and home automation. The 802.15.4 standard provides data rates of 250 kbps, 40 kbps, and 20 kbps., two addressing modes; 16-bit short and 64-bit IEEE addressing, support for critical latency devices, such as joysticks, Carrier Sense Multiple Access/Collision Avoidance, (CSMA-CA) channel access, automatic network establishment by a coordinator, a full handshake protocol for transfer reliability, power management to ensure low power consumption for multi-month to multi-year battery usage and up to 16 channels in the 2.4 GHz Industrial, Scientific and Medical (ISM) band (Worldwide), 10 channels in the 915 MHz (US) and one channel in the 868 MHz band (Europe). The IEEE 802.15.4-2003 standard is incorporated herein by reference.

WiMAX is an industry trade organization formed by leading communications component and equipment companies to promote and certify compatibility and interoperability of broadband wireless access equipment that conforms to the IEEE 802.16XX and ETSI HIPERMAN. HIPERMAN is the European standard for metropolitan area networks (MAN).

The IEEE 802.16a and 802.16g standards are wireless MAN technology standard that provides a wireless alternative to cable, DSL and T1/E1 for last mile broadband access. It is also used as complimentary technology to connect IEEE 802.11XX hot spots to the Internet.

The IEEE 802.16a standard for 2-11 GHz is a wireless MAN technology that provides broadband wireless connectivity to fixed, portable and nomadic devices. It provides up to 50-kilometers of service area range, allows users to get broadband connectivity without needing direct line of sight with the base station, and provides total data rates of up to 280 Mbps per base station, which is enough bandwidth to simultaneously support hundreds of businesses with T1/E1-type connectivity and thousands of homes with DSL-type connectivity with a single base station. The IEEE 802.16g provides up to 100 Mbps.

The IEEE 802.16e standard is an extension to the approved IEEE 802.16/16a/16g standard. The purpose of 802.16e is to add limited mobility to the current standard which is designed for fixed operation.

The ESTI HIPERMAN standard is an interoperable broadband fixed wireless access standard for systems operating at radio frequencies between 2 GHz and 11 GHz.

The IEEE 802.16a, 802.16e and 802.16g standards are incorporated herein by reference. WiMAX can be used to provide a WLP.

The ETSI HIPERMAN standards TR 101 031, TR 101 475, TR 101 493-1 through TR 101 493-3, TR 101 761-1 through TR 101 761-4, TR 101 762, TR 101 763-1 through TR 101 763-3 and TR 101 957 are incorporated herein by reference. ETSI HIPERMAN can be used to provide a WLP.

In one embodiment, the plural server network devices 20, 22, 24, 26 include a connection to plural network interface cards (NICs) in a backplane connected to a communications bus. The NIC cards provide gigabit/second ($1 \times 10^9$ bits/second) communications speed of electronic information. This allows "scaling out" for fast electronic content retrieval. The NICs are connected to the plural server network devices 20, 22, 24, 26 and the cloud communications network 18. However, the present invention is not limited to the NICs described and other types of NICs in other configurations and connections with and/or without buses can also be used to practice the invention.

In one embodiment of the invention, the WiMAX interface includes WiMAX 4G Long Term Evolution (LTE) interfaces. The ITU announced in December 2010 that WiMAX and LTE are 4G technologies. One of the benefits of 4G LTE is the ability to take advantage of advanced topology networks including those on cloud communications networks 18 such as optimized heterogeneous networks with a mix of macrocells with low power nodes such as picocells, femtocells and new relay nodes. LTE further improves the capacity and coverage, and helps ensures user fairness. 4G LTE also introduces multicarrier technologies for ultra-wide bandwidth use, up to 100 MHz of spectrum supporting very high data rates.

In one embodiment, of the invention, the wireless interfaces also include wireless personal area network (WPAN) interfaces. As is known in the art, a WPAN is a personal area network for interconnecting devices centered around an individual person's devices in which the connections are wireless. A WPAN interconnects all the ordinary computing and communicating devices that a person has on their desk (e.g. computer, etc.) or carry with them (e.g., PDA, mobile phone, smart phone, table computer two-way pager, etc.)

A key concept in WPAN technology is known as "plugging in." In the ideal scenario, when any two WPAN-equipped devices come into close proximity (within several meters and/or feet of each other) or within a few miles and/or kilometers of a central server (not illustrated), they can communicate via wireless communications as if connected by a cable. WPAN devices can also lock out other devices selectively, preventing needless interference or unauthorized access to secure information. Zigbee is one wireless protocol used on WPAN networks such as cloud communications network 18 or non-cloud communications network 18'.

The one or more target network devices 12, 14, 16 and one or more server network devices 20, 22, 24, 26 communicate with each other and other network devices with near field communications (NFC) and/or machine-to-machine (M2M) communications.

"Near field communication (NFC)" is a set of standards for smartphones and similar network devices to establish radio communication with each other by touching them together or bringing them into close proximity, usually no more than a few centimeters. Present applications include contactless transactions, data exchange, and simplified setup of more complex communications such as Wi-Fi. Communication is also possible between an NFC device and an unpowered NFC chip, called a "tag" including radio frequency identifier (RFID) tags and/or sensor.

NFC standards cover communications protocols and data exchange formats, and are based on existing radio-frequency identification (RFID) standards including ISO/IEC 14443 and FeliCa. These standards include ISO/IEC 1809 and those defined by the NFC Forum, all of which are incorporated by reference.

An "RFID tag" is an object that can be applied to or incorporated into a product, animal, or person for the purpose of identification and/or tracking using RF signals.

An "RFID sensor" is a device that measures a physical quantity and converts it into an RF signal which can be read by an observer or by an instrument (e.g., target network devices 12, 14, 16, server network devices 20, 22, 24, 26, etc.)

"Machine to machine (M2M)" refers to technologies that allow both wireless and wired systems to communicate with other devices of the same ability. M2M uses a device to capture an event (such as option purchase, etc.), which is relayed through a network (wireless, wired cloud, etc.) to an application (software program), that translates the captured event into meaningful information. Such communication was originally accomplished by having a remote network of machines relay information back to a central hub for analysis, which would then be rerouted into a system like a personal computer.

However, modern M2M communication has expanded beyond a one-to-one connection and changed into a system of networks that transmits data many-to-one and many-to-many to plural different types of devices and appliances. The expansion of IP networks across the world has made it far easier for M2M communication to take place and has lessened the amount of power and time necessary for information to be communicated between machines.

However, the present invention is not limited to such wireless interfaces and wireless networks and more, fewer and/or other wireless interfaces can be used to practice the invention.

Wired Interfaces

In one embodiment of the present invention, the wired interfaces include wired interfaces and corresponding networking protocols for wired connections to the Public Switched Telephone Network (PSTN) and/or a cable television network (CATV) and/or satellite television networks (SATV) and/or three-dimensional television (3DTV), including HDTV that connect the network devices 12, 14, 16, 20, 22, 24, 26 via one or more twisted pairs of copper wires, digital subscriber lines (e.g. DSL, ADSL, VDSL, etc.) coaxial cable, fiber optic cable, other connection media or other connection interfaces. The PSTN is any public switched telephone network provided by AT&T, GTE, Sprint, MCI, SBC, Verizon and others. The CATV is any cable television network provided by the Comcast, Time Warner, etc. However, the present invention is not limited to such wired interfaces and more, fewer and/or other wired interfaces can be used to practice the invention.

Television Services

In one embodiment, the cloud applications 30, 30' provide cloud electronic content storage and retrieval services from television services over the cloud communications network 18 or non-cloud communications network 18'. The television services include digital television services, including, but not limited to, cable television, satellite television, high-definition television, three-dimensional, televisions and other types of network devices.

However, the present invention is not limited to such television services and more, fewer and/or other television services can be used to practice the invention.

Internet Television Services

In one embodiment, the cloud applications 30, 30' provide cloud electronic content storage and retrieval services from Internet television services over the cloud communications network 18 or non-cloud communications network 18' The television services include Internet television, Web-TV, and/or Internet Protocol Television (IPtv) and/or other broadcast television services.

"Internet television" allows users to choose a program or the television show they want to watch from an archive of programs or from a channel directory. The two forms of viewing Internet television are streaming content directly to a media player or simply downloading a program to a viewer's set-top box, game console, computer, or other network device.

"Web-TV" delivers digital content via broadband and mobile networks. The digital content is streamed to a viewer's set-top box, game console, computer, or other network device.

"Internet Protocol television (IPtv)" is a system through which Internet television services are delivered using the architecture and networking methods of the Internet Protocol Suite over a packet-switched network infrastructure, e.g., the Internet and broadband Internet access networks, instead of being delivered through traditional radio frequency broadcast, satellite signal, and cable television formats.

However, the present invention is not limited to such Internet Television services and more, fewer and/or other Internet Television services can be used to practice the invention.

General Search Engine Services

In one embodiment, the cloud applications 30, 30' provide cloud electronic content storage and retrieval services from general search engine services. A search engine is designed to search for information on a cloud communications network 18 or non-cloud communications network 18' such as the Internet including World Wide Web servers, HTTP, FTP servers etc. The search results are generally presented in a list of electronic results. The information may consist of web pages, images, electronic information, multimedia information, and other types of files. Some search engines also mine data available in databases or open directories. Unlike web directories, which are maintained by human editors, search engines typically operate algorithmically and/or are a mixture of algorithmic and human input.

In one embodiment, the cloud applications 30, 30' provide cloud electronic content storage and retrieval services from general search engine services. In another embodiment, the cloud applications 30, 30' provide general search engine services by interacting with one or more other public search engines (e.g., GOOGLE, BING, YAHOO, etc.) and/or private search engine services.

In another embodiment, the cloud applications 30, 30' provide electronic content storage and retrieval services from specialized search engine services, such as vertical search engine services by interacting with one or more other public vertical search engines (e.g., GALAXY.COM, etc.) and/or private search engine services.

However, the present invention is not limited to such general and/or vertical search engine services and more, fewer and/or other general search engine services can be used to practice the invention.

Social Networking Services

In one embodiment, the cloud applications 30, 30' provide cloud electronic content storage and retrieval services from one more social networking services including to/from one or more social networking web-sites (e.g., FACEBOOK, YOUTUBE, TWITTER, MY-SPACE, MATCH.COM, E-HARMONY, GROUP ON, SOCIAL LIVING, etc.). The social networking web-sites also include, but are not limited to, social couponing sites, dating web-sites, blogs, RSS feeds, and other types of information web-sites in which messages can be left or posted for a variety of social activities.

However, the present invention is not limited to the social networking services described and other public and private social networking services can also be used to practice the invention.

Security and Encryption

Network devices 12, 14, 16, 20, 22, 24, 26 with wired and/or wireless interfaces of the present invention include one or more of the security and encryptions techniques discussed herein for secure communications on the cloud communications network 18 or non-cloud communications network 18'.

Application programs 58 (FIG. 2) include security and/or encryption application programs integral to and/or separate from the applications 30, 30' Security and/or encryption programs may also exist in hardware components on the network devices (12, 14, 16, 20, 22, 24, 26) described herein and/or exist in a combination of hardware, software and/or firmware.

Wireless Encryption Protocol (WEP) (also called "Wired Equivalent Privacy) is a security protocol for WiLANs defined in the IEEE 802.11b standard. WEP is cryptographic privacy algorithm, based on the Rivest Cipher 4 (RC4) encryption engine, used to provide confidentiality for 802.11b wireless data.

RC4 is cipher designed by RSA Data Security, Inc. of Bedford, Mass., which can accept encryption keys of arbitrary length, and is essentially a pseudo random number generator with an output of the generator being XORed with a data stream to produce encrypted data.

One problem with WEP is that it is used at the two lowest layers of the OSI model, the physical layer and the data link layer, therefore, it does not offer end-to-end security. One another problem with WEP is that its encryption keys are static rather than dynamic. To update WEP encryption keys, an individual has to manually update a WEP key. WEP also typically uses 40-bit static keys for encryption and thus provides "weak encryption," making a WEP device a target of hackers.

The IEEE 802.11 Working Group is working on a security upgrade for the 802.11 standard called "802.11i." This supplemental draft standard is intended to improve WiLAN security. It describes the encrypted transmission of data between systems 802.11X WiLANs. It also defines new encryption key protocols including the Temporal Key Integrity Protocol (TKIP). The IEEE 802.11i draft standard, version 4, completed Jun. 6, 2003, is incorporated herein by reference.

The 802.11i standard is based on 802.1x port-based authentication for user and device authentication. The 802.11i standard includes two main developments: Wi-Fi Protected Access (WPA) and Robust Security Network (RSN).

WPA uses the same RC4 underlying encryption algorithm as WEP. However, WPA uses TKIP to improve security of keys used with WEP. WPA keys are derived and rotated more often than WEP keys and thus provide additional security. WPA also adds a message-integrity-check function to prevent packet forgeries.

RSN uses dynamic negotiation of authentication and selectable encryption algorithms between wireless access points and wireless devices. The authentication schemes proposed in the draft standard include Extensible Authentication Protocol (EAP). One proposed encryption algorithm is an Advanced Encryption Standard (AES) encryption algorithm.

Dynamic negotiation of authentication and encryption algorithms lets RSN evolve with the state of the art in security, adding algorithms to address new threats and continuing to provide the security necessary to protect information that WiLANs carry.

The NIST developed a new encryption standard, the Advanced Encryption Standard (AES) to keep government information secure. AES is intended to be a stronger, more efficient successor to Triple Data Encryption Standard (3DES).

DES is a popular symmetric-key encryption method developed in 1975 and standardized by ANSI in 1981 as ANSI X.3.92, the contents of which are incorporated herein by reference. As is known in the art, 3DES is the encrypt-decrypt-encrypt (EDE) mode of the DES cipher algorithm. 3DES is defined in the ANSI standard, ANSI X9.52-1998, the contents of which are incorporated herein by reference. DES modes of operation are used in conjunction with the NIST Federal Information Processing Standard (FIPS) for data encryption (FIPS 46-3, October 1999), the contents of which are incorporated herein by reference.

The NIST approved a FIPS for the AES, FIPS-197. This standard specified "Rijndael" encryption as a FIPS-approved symmetric encryption algorithm that may be used by U.S. Government organizations (and others) to protect sensitive information. The NIST FIPS-197 standard (AES FIPS PUB 197, November 2001) is incorporated herein by reference.

The NIST approved a FIPS for U.S. Federal Government requirements for information technology products for sensitive but unclassified (SBU) communications. The NIST FIPS Security Requirements for Cryptographic Modules (FIPS PUB 140-2, May 2001) is incorporated herein by reference.

RSA is a public key encryption system which can be used both for encrypting messages and making digital signatures. The letters RSA stand for the names of the inventors: Rivest, Shamir and Adleman. For more information on RSA, see U.S. Pat. No. 4,405,829, now expired and incorporated herein by reference.

"Hashing" is the transformation of a string of characters into a usually shorter fixed-length value or key that represents the original string. Hashing is used to index and retrieve items in a database because it is faster to find the item using the shorter hashed key than to find it using the original value. It is also used in many encryption algorithms.

Secure Hash Algorithm (SHA), is used for computing a secure condensed representation of a data message or a data file. When a message of any length $<2^{64}$ bits is input, the SHA-1 produces a 160-bit output called a "message digest." The message digest can then be input to other security techniques such as encryption, a Digital Signature Algorithm (DSA) and others which generates or verifies a security mechanism for the message. SHA-512 outputs a 512-bit message digest. The Secure Hash Standard, FIPS PUB 180-1, Apr. 17, 1995, is incorporated herein by reference.

Message Digest-5 (MD-5) takes as input a message of arbitrary length and produces as output a 128-bit "message digest" of the input. The MD5 algorithm is intended for digital signature applications, where a large file must be "compressed" in a secure manner before being encrypted with a private (secret) key under a public-key cryptosystem such as RSA. The IETF RFC-1321, entitled "The MD5 Message-Digest Algorithm" is incorporated here by reference.

Providing a way to check the integrity of information transmitted over or stored in an unreliable medium such as a wireless network is a prime necessity in the world of open computing and communications. Mechanisms that provide such integrity check based on a secret key are called "message authentication codes" (MAC). Typically, message authentication codes are used between two parties that share a secret key in order to validate information transmitted between these parties.

Keyed Hashing for Message Authentication Codes (HMAC), is a mechanism for message authentication using cryptographic hash functions. HMAC is used with any iterative cryptographic hash function, e.g., MD5, SHA-1, SHA-512, etc. in combination with a secret shared key. The cryptographic strength of HMAC depends on the properties of the underlying hash function. The IETF RFC-2101, entitled "HMAC: Keyed-Hashing for Message Authentication" is incorporated here by reference.

An Electronic Code Book (ECB) is a mode of operation for a "block cipher," with the characteristic that each possible block of plaintext has a defined corresponding cipher text value and vice versa. In other words, the same plaintext value will always result in the same cipher text value. Electronic Code Book is used when a volume of plaintext is separated into several blocks of data, each of which is then encrypted independently of other blocks. The Electronic Code Book has the ability to support a separate encryption key for each block type.

Diffie and Hellman (DH) describe several different group methods for two parties to agree upon a shared secret in such a way that the secret will be unavailable to eavesdroppers. This secret is then converted into various types of cryptographic keys. A large number of the variants of the DH method exist including ANSI X9.42. The IETF RFC-2631, entitled "Diffie-Hellman Key Agreement Method" is incorporated here by reference.

The HyperText Transport Protocol (HTTP) Secure (HTTPs), is a standard for encrypted communications on the World Wide Web. HTTPs is actually just HTTP over a Secure Sockets Layer (SSL). For more information on HTTP, see IETF RFC-2616 incorporated herein by reference.

The SSL protocol is a protocol layer which may be placed between a reliable connection-oriented network layer protocol (e.g. TCP/IP) and the application protocol layer (e.g. HTTP). SSL provides for secure communication between a source and destination by allowing mutual authentication, the use of digital signatures for integrity, and encryption for privacy.

The SSL protocol is designed to support a range of choices for specific security methods used for cryptography, message digests, and digital signatures. The security methods are negotiated between the source and destination at the start of establishing a protocol session. The SSL 2.0 protocol specification, by Kipp E. B. Hickman, 1995 is incorporated herein by reference.

Transport Layer Security (TLS) provides communications privacy over the Internet. The protocol allows client/server applications to communicate over a transport layer (e.g., TCP) in a way that is designed to prevent eavesdropping, tampering, or message forgery. For more information on TLS see IETF RFC-2246, incorporated herein by reference.

In one embodiment, the security functionality includes Cisco Compatible EXtensions (CCX). CCX includes security specifications for makers of 802.11xx wireless LAN chips for ensuring compliance with Cisco's proprietary wireless security LAN protocols. As is known in the art, Cisco Systems, Inc. of San Jose, Calif. is supplier of networking hardware and software, including router and security products.

In one embodiment, the security functionality includes blockchains. A "blockchain" is a public ledger of all transactions that have ever been executed. It is constantly growing as completed blocks are added to it with a new set of recordings. The blocks are added to the blockchain in a linear, chronological order. Blockchains are used on Peer-2-Peer (P2P) networks and other networks such as cloud communications networks 18. Each P2P node gets a copy of the blockchain, which gets downloaded automatically upon joining P2P. The blockchain has complete information about the block owners and block content right from the first block to the most recently completed block.

A "blockchain" is also a digital ledger that records every transaction that has ever occurred. Blockchains and transactions on blockchains are typically protected by cryptography. More importantly, though, the blockchain does not reside in a single server, but across a distributed network of servers and computer such as a cloud computing network and a P2P computing network. Accordingly, whenever new transactions occur, a new blockchain is authenticated across this distributed network, then the transaction is included as a new "block" on the "chain." A block chain implementation comprises of two kinds of records: transactions and blocks.

"Transactions" are the content to be stored in the block chain (e.g., financial transactions, etc.). Transactions are created by participants using the system. In the case of cryptocurrencies, a transaction is created any time a cryptocurrency owner sends cryptocurrency to someone.

A transaction is also a transfer of value between digital wallets that gets included in the block chain. Digital wallets, including BITCOIN wallets, store a secret piece of data called a "private key" or, which is used to digitally sign transactions, providing a mathematical proof that the digital signature has actually come from the owner of the digital wallet.

System users create transactions that are passed from node to node on a best-effort basis. The system implementing the blockchain defines a valid transaction. In cryptocurrency applications, a valid transaction must be digitally signed, spend one or more unspent outputs of previous transactions, and the sum of transaction outputs must not exceed the sum of inputs.

Blocks record and confirm when and in what sequence transactions enter and are logged in the block chain. Blocks are created by users known as "miners" who use specialized software or equipment designed specifically to create blocks.

Blockchains are decentralized and do not require a "central authority" or "middleman." Every node in a decentralized system has a copy of the block chain. This avoids the need to have a centralized database managed by a trusted third party. Blockchain transactions are broadcast to a network using software applications. Network nodes can validate transactions, add them to their copy and then broadcast these additions to other nodes. To avoid the need for a trusted third party to timestamp transactions, decentralized block chains use various timestamping schemes, such as proof-of-work.

However, the present invention is not limited to such security and encryption methods described herein and more, fewer and/or other types of security and encryption methods can be used to practice the invention. The security and encryption methods described herein can also be used in various combinations and/or in different layers of the protocol stack 38 with each other.

Cloud Computing Networks

Figure 4:
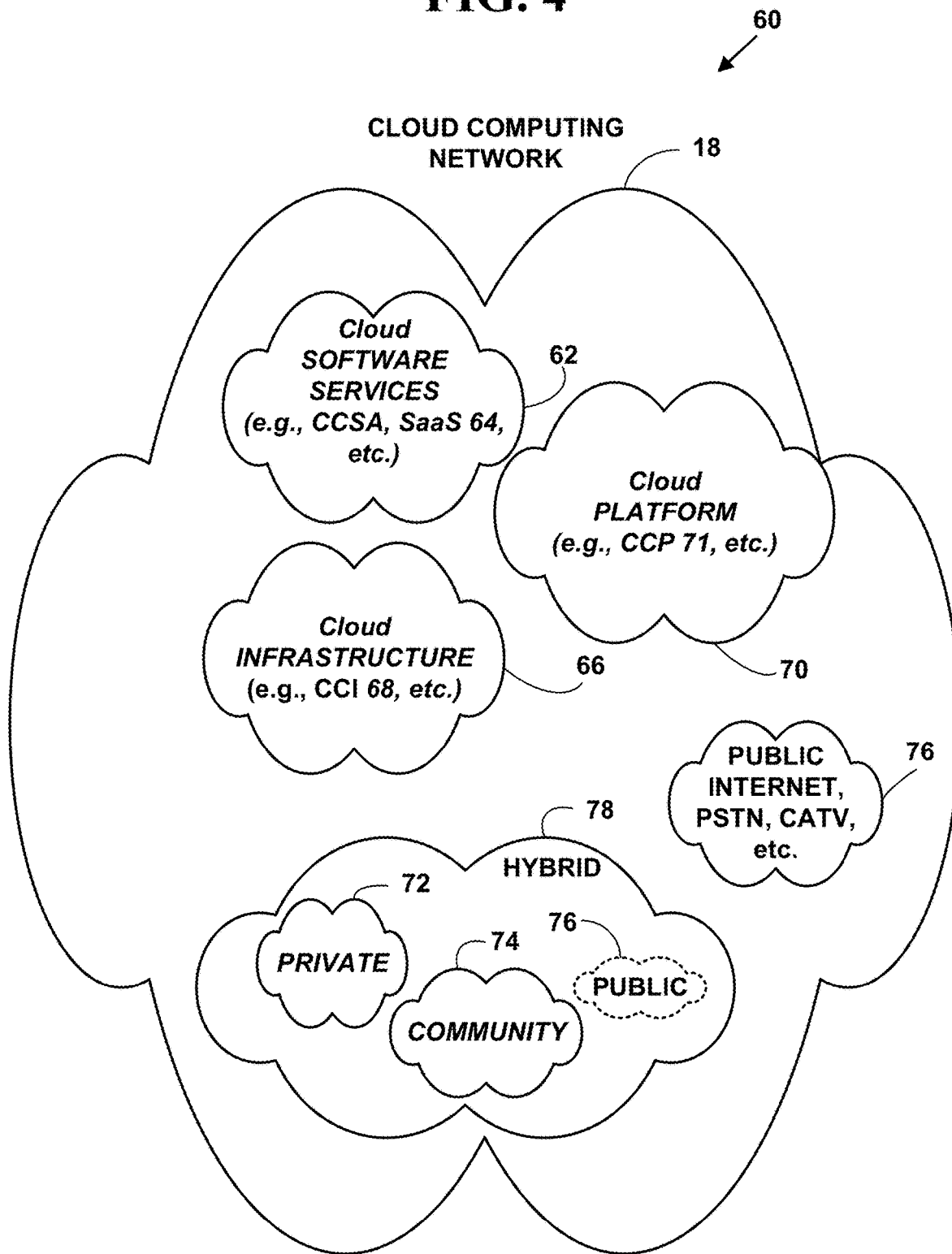
FIG. 4 is block diagram illustrating an exemplary cloud communications network.

FIG. 4 is a block diagram 60 illustrating an exemplary cloud computing network 18. The cloud computing network 18 is also referred to as a "cloud communications network" 18. However, the present invention is not limited to this cloud computing model and other cloud computing models can also be used to practice the invention. The exemplary cloud communications network includes both wired and/or wireless components of public and private networks.

In one embodiment, the cloud computing network 18 includes a cloud communications network 18 comprising plural different cloud component networks 72, 74, 76, 78. "Cloud computing" is a model for enabling, on-demand network access to a shared pool of configurable computing resources (e.g., public and private networks, servers, storage, applications, and services) that are shared, rapidly provisioned and released with minimal management effort or service provider interaction.

This exemplary cloud computing model for electronic information retrieval promotes availability for shared resources and comprises: (1) cloud computing essential characteristics; (2) cloud computing service models; and (3) cloud computing deployment models. However, the present invention is not limited to this cloud computing model and other cloud computing models can also be used to practice the invention.

Exemplary cloud computing essential characteristics appear in Table 1. However, the present invention is not limited to these essential characteristics and more, fewer or other characteristics can also be used to practice the invention.

TABLE 1

1. On-demand Bill of Materials creation services. Bill of Materials creation
converters can unilaterally provision computing capabilities, such as
server time and network storage, as needed automatically without
requiring human interaction with each network server on the cloud
communications network 18.
2. Broadband network access. Bill of Materials creation capabilities are
available over plural broadband communications networks and accessed
through standard mechanisms that promote use by heterogeneous thin or
thick client platforms (e.g., mobile phones, smart phones 14, tablet
computers 12, laptops, PDAs, etc.). The broadband network access
includes high speed network access such as 3G and/or 4G wireless
and/or wired and broadband and/or ultra-broad band (e.g., WiMAX, etc.)
network access.
3. Resource pooling. Bill of Materials creation computing resources are
pooled to serve multiple requesters using a multi-tenant model, with
different physical and virtual resources dynamically assigned and re-
assigned according to electronic content retrieval demand. There is location
independence in that a requester of automatic Bill of Materials creation
services has no control and/or knowledge over the exact location of the
provided by the automatic Bill of Materials creation resources but may be
able to specify location at a higher level of abstraction (e.g., country,
state, or data center). Examples of pooled resources include storage,
processing, memory, network bandwidth, virtual server network device
and virtual target network devices.
4. Rapid elasticity. Capabilities can be rapidly and elastically provisioned,
in some cases automatically, to quickly scale out and rapidly released to
quickly scale for Bill of Materials creation. For Bill of Materials creation
converters, the Bill of Materials creation capabilities available for
provisioning appear to be unlimited and can be used in any quantity at
any time.
5. Measured Services. Cloud computing systems automatically control and
optimize resource use by leveraging a metering capability at some level
of abstraction appropriate to the type of Bill of Materials creation service
(e.g., storage, processing, bandwidth, custom electronic content retrieval
applications, etc.). Electronic Bill of Materials creation usage is
monitored, controlled, and reported providing transparency for both Bill
of Materials creation provider and the Bill of Materials creation requester
of the utilized electronic content storage retrieval service.

Exemplary cloud computing service models illustrated in FIG. 4 appear in Table 2. However, the present invention is not limited to these service models and more, fewer or other service models can also be used to practice the invention.

TABLE 2

1. Cloud Computing Software Applications 62 for a Bill of Materials Creation Service (CCSA 64). The capability to use the provider's applications 30, 30' running on a cloud infrastructure 66. The cloud computing applications 62 are accessible from the server network device 22 from various client devices 12, 14, 16 through a thin client interface such as a web browser, etc. The user does not manage or control the underlying cloud infrastructure 66 including network, servers, operating systems, storage, or even individual application 30, 30' capabilities, with the possible exception of limited user-specific application configuration settings.
2. Cloud Computing Infrastructure 66 for the Bill of Materials Creation Service (CCI 68). The capability provided to the user is to provision processing, storage and retrieval, networks 18, 72, 74, 76, 78 and other fundamental computing resources where the consumer is able to deploy and run arbitrary software, which can include operating systems and applications 30, 30'. The user does not manage or control the underlying cloud infrastructure 66 but has control over operating systems, storage, deployed applications, and possibly limited control of select networking components (e.g., host firewalls, etc.).
3. Cloud Computing Platform 70 for the Bill of Materials Creation Service (CCP 71). The capability provided to the user to deploy onto the cloud infrastructure 66 created or acquired applications created using programming languages and tools supported servers 20, 22, 24, 26, etc.. The user does not manage or control the underlying cloud infrastructure 66 including network, servers, operating systems, or storage, but has control over the deployed applications 30, 30' and possibly application hosting environment configurations.

Exemplary cloud computing deployment models appear in Table 3. However, the present invention is not limited to these deployment models and more, fewer or other deployment models can also be used to practice the invention.

TABLE 3

1. Private cloud network 72. The cloud network infrastructure is operated solely for automatic Bill of Materials creation. It may be managed by the electronic content retrieval or a third party and may exist on premise or off premise.
2. Community cloud network 74. The cloud network infrastructure is shared by several different organizations and supports a specific electronic content storage and retrieval community that has shared concerns (e.g., mission, security requirements, policy, compliance considerations, etc.). It may be managed by the different organizations or a third party and may exist on premise or off premise.
3. Public cloud network 76. The cloud network infrastructure such as the Internet, PSTN, SATV, CATV, Internet TV, etc. is made available to the general public or a large industry group and is owned by one or more organizations selling cloud services.
4. Hybrid cloud network 78. The cloud network infrastructure 66 is a composition of two and/or more cloud networks 18 (e.g., private 72, community 74, and/or public 76, etc.) and/or other types of public and/or private networks (e.g., intranets, etc.) that remain unique entities but are bound together by standardized or proprietary technology that enables data and application portability (e.g., cloud bursting for load-balancing between clouds, etc.)

Cloud software 64 for electronic content retrieval takes full advantage of the cloud paradigm by being service oriented with a focus on statelessness, low coupling, modularity, and semantic interoperability for electronic content retrieval. However, cloud software services 64 can include various states.

Cloud storage of desired electronic content on a cloud computing network includes agility, scalability, elasticity and multi-tenancy. Although a storage foundation may be comprised of block storage or file storage such as that exists on conventional networks, cloud storage is typically exposed to requesters of desired electronic content as cloud objects.

In one exemplary embodiment, the cloud application 30', offers cloud services for automatic Bill of Materials creation. The application 30, 30' offers the cloud computing Infrastructure 66, 68 as a Service 62 (IaaS), including a cloud software infrastructure service 62, the cloud Platform 70, 71 as a Service 62 (PaaS) including a cloud software platform service 62 and/or offers Specific cloud Software as a Service 64 (SaaS) including a specific cloud software service 64 for automatic real-time (e.g., 1-10 seconds or less, etc.) Bill of Materials creation. The IaaS, PaaS and SaaS include one or more of cloud services 62 comprising networking, storage, server network device, virtualization, operating system, middleware, run-time, data and/or application services, or plural combinations thereof, on the cloud communications network 18.

Figure 5:
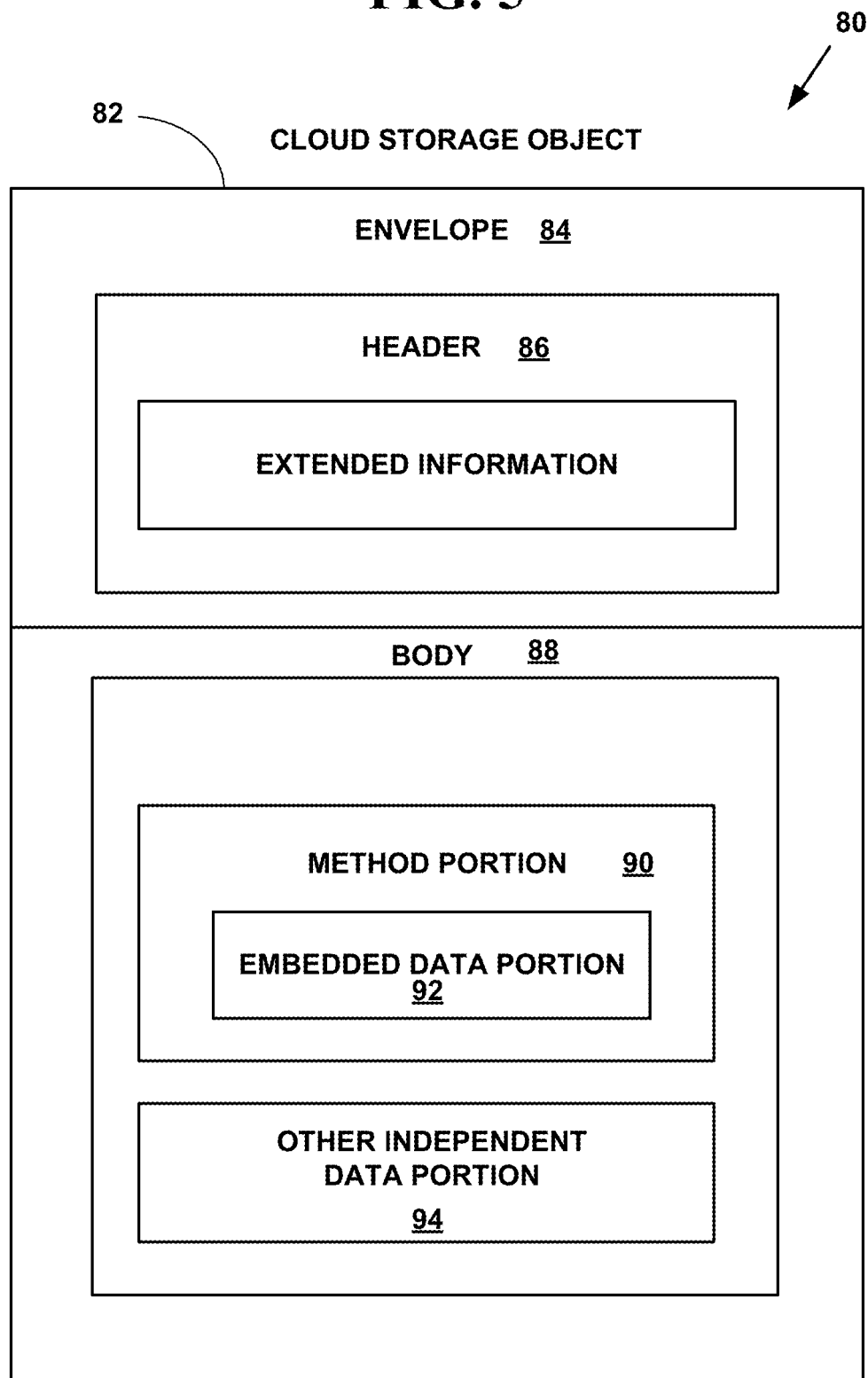
FIG. 5 is a block diagram illustrating an exemplary cloud storage object.

FIG. 5 is a block diagram 80 illustrating an exemplary cloud storage object 82.

The cloud storage object 82 includes an envelope portion 84, with a header portion 86, and a body portion 88. However, the present invention is not limited to such a cloud storage object 82 and other cloud storage objects and other cloud storage objects with more, fewer or other portions can also be used to practice the invention.

The envelope portion 84 uses unique namespace Uniform Resource Identifiers (URIs) and/or Uniform Resource Names (URNs), and/or Uniform Resource Locators (URLs) unique across the cloud communications network 18 to uniquely specify, location and version information and encoding rules used by the cloud storage object 82 across the whole cloud communications network 18. For more information, see IETF RFC-3305, Uniform Resource Identifiers (URIs), URLs, and Uniform Resource Names (URNs), the contents of which are incorporated by reference.

The envelope portion 84 of the cloud storage object 82 is followed by a header portion 86. The header portion 86 includes extended information about the cloud storage objects such as authorization and/or transaction information, etc.

The body portion 88 includes methods 90 (i.e., a sequence of instructions, etc.) for using embedded application-specific data in data elements 92. The body portion 88 typically includes only one portion of plural portions of application-specific data 92 and independent data 94 so the cloud storage object 82 can provide distributed, redundant fault tolerant, security and privacy features described herein.

Cloud storage objects 82 have proven experimentally to be a highly scalable, available and reliable layer of abstraction that also minimizes the limitations of common file systems. Cloud storage objects 82 also provide low latency and low storage and transmission costs.

Cloud storage objects 82 are comprised of many distributed resources, but function as a single storage object, are highly fault tolerant through redundancy and provide distribution of desired electronic content across public communication networks 76, and one or more private networks 72, community networks 74 and hybrid networks 78 of the cloud communications network 18. Cloud storage objects 82 are also highly durable because of creation of copies of portions of desired electronic content across such networks 72, 74, 76, 78 of the cloud communications network 18. Cloud storage objects 82 includes one or more portions of desired electronic content and can be stored on any of the 72, 74, 76, 78 networks of the cloud communications network 18. Cloud storage objects 82 are transparent to a requester of desired electronic content and are managed by cloud applications 30, 30'.

In one embodiment, cloud storage objects 82 are configurable arbitrary objects with a size up to hundreds of terabytes, each accompanied by with a few kilobytes of metadata. Cloud objects are organized into and identified by a unique identifier unique across the whole cloud communications network 18. However, the present invention is not limited to the cloud storage objects described, and more fewer and other types of cloud storage objects can be used to practice the invention.

Cloud storage objects 82 present a single unified namespace or object-space and manages desired electronic content by user or administrator-defined policies storage and retrieval policies. Cloud storage objects includes Representational state transfer (REST), Simple Object Access Protocol (SOAP), Lightweight Directory Access Protocol (LDAP) and/or Application Programming Interface (API) objects and/or other types of cloud storage objects. However, the present invention is not limited to the cloud storage objects described, and more fewer and other types of cloud storage objects can be used to practice the invention.

REST is a protocol specification that characterizes and constrains macro-interactions storage objects of the four components of a cloud communications network 18, namely origin servers, gateways, proxies and clients, without imposing limitations on the individual participants.

SOAP is a protocol specification for exchanging structured information in the implementation of cloud services with storage objects. SOAP has at least three major characteristics: (1) Extensibility (including security/encryption, routing, etc.); (2) Neutrality (SOAP can be used over any transport protocol such as HTTP, SMTP or even TCP, etc.), and (3) Independence (SOAP allows for almost any programming model to be used, etc.)

LDAP is a software protocol for enabling storage and retrieval of electronic content and other resources such as files and devices on the cloud communications network 18. LDAP is a "lightweight" version of Directory Access Protocol (DAP), which is part of X.500, a standard for directory services in a network. LDAP may be used with X.509 security and other security methods for secure storage and retrieval. X.509 is public key digital certificate standard developed as part of the X.500 directory specification. X.509 is used for secure management and distribution of digitally signed certificates across networks.

An Application Program Interface (API) is a particular set of rules and specifications that software programs can follow to communicate with each other. It serves as an interface between different software programs and facilitates their interaction.

Wearable Devices

Wearable technology" and/or "wearable devices" are clothing and accessories incorporating computer and advanced electronic technologies. Wearable network devices provide several advantages including, but not limited to: (1) Quicker access to notifications. Important and/or summary notifications are sent to alert a user to view the whole message (2) Heads-up information. Digital eye wear allows users to display relevant information like directions without having to constantly glance down; (3) Always-on Searches. Wearable devices provide always-on, hands-free searches; and (4) Recorded data and feedback. Wearable devices take telemetric data recordings and providing useful feedback for users for exercise, health, fitness, etc. activities.

Figure 6:
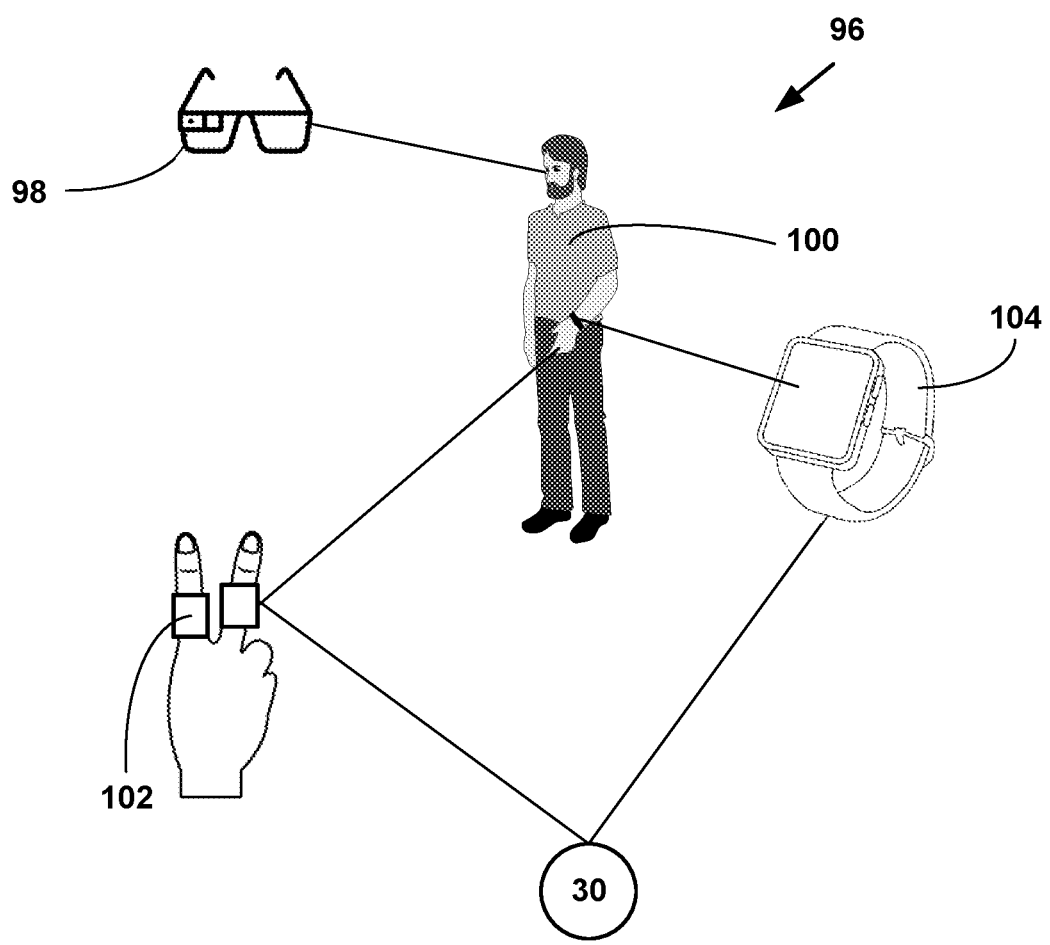
FIG. 6 is a block diagram with illustrating wearable devices.

FIG. 6 is a block diagram with 96 illustrating wearable devices. The wearable devices include one or more processors and include, but are not limited to, wearable digital glasses 98, clothing 100 (e.g., smart ties, shirts, pants, shoes, etc.), jewelry 102 (e.g., smart rings, smart earrings, etc.) and/or watches, fitness bands/trackers, etc. 104. However, the present invention is not limited to such embodiments and more, fewer and other types of wearable devices can also be used to practice the invention.

In one specific embodiment, the application 30, 30' interacts with wearable devices 98-104 and cloud IaaS 66, PaaS 70 and SaaS 64 services for automatic real-time Bill of Materials creation with the methods described herein on a cloud communications network 18' and/or a non-cloud communications network 18.

Building Information Modeling (BIM)

Building Information Modeling (BIM) is a process including the generation and management of digital representations of physical and functional characteristics of physical spaces. Building Information Models (BIMs) are files (often but not always in proprietary formats and containing proprietary data) which can be exchanged or networked to support decision-making.

Current BIM software is used by individuals, businesses and government authorities who plan, design, construct, operate and maintain diverse physical infrastructures, from water, wastewater, electricity, gas, refuse, and communication utilities to roads, bridges and ports, from houses, apartments, schools and shops to offices, factories, warehouses, etc.

BIM modeling programs include two-dimensional (2D) and three-dimensional (3D) modeling programs. In one specific embodiment, the BIM modeling programs includes an AUTODESK REVIT, AUTOCAD, VECTORWORKS, MICROSTATION, ARCHICAD, SOLIDWORKS, TC CREO, SKETCHUP and/or other BIM modeling program. However, the present invention is not limited to such an embodiment and other BIM modeling programs can be used to practice the invention.

AUTODESK REVIT, is Building Information Modeling (BIM) software for architects, structural engineers, Mechanical, Electrical, Plumbing (MEP) engineers, designers and contractors. It allows users to design a building and structure and its components in 3D, annotate the model with 2D drafting elements and access building information from the building models database. REVIT is 4D BIM capable with tools to plan and track various stages in the building's lifecycle, from concept to construction and later demolition.

AUTODESK INVENTOR, is a 3D mechanical CAD design software for creating 3D digital prototypes used in the design, visualization and simulation of products.

AUTOCAD is a software application for 2D and 3D computer-aided design (CAD) and drafting. It has been available since 1982 as a desktop application and since 2010 as a mobile web- and cloud-based application, currently marketed as AUTOCAD 360.

VECTORWORKS is a computer-aided design (CAD) and Building Information Modeling (BIM) software program developed by Nemetschek. VECTORWORKS that is used for drafting, technical drawing and 3D modeling. VECTORWORKS offers 2D, 3D, production management, and presentation capabilities for all phases of the design process.

BENTLEY SYSTEM, INC, is a software company that produces solutions for the design, construction and operation of infrastructure. The company's software serves the building, plant, civil, and geospatial markets in the areas of architecture, engineering, construction (AEC) and operations. Their software solutions are used to design, engineer, build, and operate large constructed assets such as roadways, railways, bridges, buildings, industrial and power plants and utility networks.

BENTLEY'S principal software solution is MICROSTATION. MIRCOSTATION is a desktop 2D/3D CAD platform upon which BENTLEY and third-party software companies build more specific solutions. For example, BENTLEY MAP is an extension from BENTLEY that runs on top of MICROSTATION adding Graphic Information System (GIS) and spatial capabilities to the CAD program.

The latest versions of MICROSTATION are released solely for MICROSOFT WINDOWS operating systems, but historically MICROSTATION was available for APPLE MACINTOSH platforms and a number of UNIX-like operating systems. MICROSTATION is the platform architectural and engineering software package developed by BENTLEY SYSTEMS, Incorporated. Among a number of things, it generates 2D/3D vector graphic objects and elements.

BENTLEY is also a provider of Building information modeling (BIM) solutions for the Architecture, Structural, Mechanical and Electrical engineering disciplines. BENTLEY also provides GENERATIVE COMPONENTS, a parametric modeling solution used primarily by architects and engineers in building design.

ARCHICAD is an architectural BIM CAD software for APPLE MACINTOSH and Microsoft Windows developed by the Hungarian company GRAPHISOFT. ARCHICAD offers specialized solutions for handling all common aspects of aesthetics and engineering during the whole design process of the built environment—buildings, interiors, urban areas, etc.

Development of ARCHICAD started in 1982 for the original APPLE MACINTOSH. ARCHICAD is recognized as the first CAD product on a personal computer able to create both 2D drawings and parametric 3D geometry.[1] In its debut in 1987 ARCHICAD also became the first implementation of BIM under GRAPHISOFT's "Virtual Building" concept.

SOLIDWORKS is a 3D mechanical CAD program that runs on MICROSOFT WINDOWS and is developed by DASSAULT SYSTÈMES SOLIDWORKS CORP., a subsidiary of DASSAULT SYSTÈMES, S. A. (Vélizy, France).

TC CREO, formerly known as PRO/ENGINEER or PRO/E is a parametric, integrated 3D CAD/CAM/CAE solution created by PARAMETRIC TECHNOLOGY CORPORATION (PTC). It was the first to market with parametric, feature-based, associative solid modeling software. The application runs on MICROSOFT WINDOWS platform, and provides solid modeling, assembly modeling and drafting, finite element analysis, Direct and Parametric modeling, Sub-divisional and nurbs surfacing and NC and tooling functionality for mechanical engineers.

SKETCHUP (Formerly: GOOGLE SKETCHUP) is a 3D modeling program for applications such as architectural, interior design, civil and mechanical engineering, film, and video game design. A freeware version, SKETCHUP MAKE, and a paid version with additional functionality, SKETCHUP PRO, are available.

There is an online Open source repository of free-of-charge model assemblies (e.g., windows, doors, automobiles, etc.), 3D WAREHOUSE, to which users may contribute models. The program includes drawing layout functionality, allows surface rendering in variable "styles", supports third-party "plug-in" programs hosted on a site called Extension Warehouse to provide other capabilities (e.g., near photo-realistic rendering), and enables placement of its models within GOOGLE EARTH.

SKETCHUP can export 3D to Digital Asset Exchange, .DAE and GOOGLE EARTH's Keyhole Markup Language, .KMZ file format. The Pro version extends exporting support to include the AUTOCAD 3D STUDIO DOS, .3DS, AUTOCAD DRAWING, .DWG, AutoCAD DXF (Drawing interchange Format, or Drawing Exchange Format), .DFX, KAYDARA Filmbox, .FBX, Object geometry definition, .OBJ., AUTODESK Softimage, .XSK, and Virtual Reality Modeling Language .WRL, file formats. GOOGLE SKETCHUP can also save elevations or renderings of the model, called "screenshots", as Bitmap, .BMP, Portable Network Graphics, .PNG, JPEG, .JPG, Tagged Image File Format, .TIF, with the Pro version also supporting Portable Document Format, .PDF, Encapsulated Postscript, .EPS and .EPX, Drawing, .DWG, and AUTOCAD Drawing Exchange format, .DXF.

A "4D BIM" is a term widely used in the CAD industry, refers to the intelligent linking of individual 3D CAD components or assemblies with time or schedule-related information. The use of the term 4D is intended to refer to the fourth dimension: schedule-time (i.e., 4D is 3D+schedule-time).

The construction of the 4D models enables the various participants (e.g., from architects, designers, contractors to owners) of a construction project, to visualize the entire duration of a series of events and display the progress of construction activities through the lifetime of the project. This BIM-centric approach towards project management technique has a very high potential to improve the project management and delivery of construction project, of any size or complexity.

A "5D BIM" is also term widely used in the CAD industry, which refers to the intelligent linking of individual 3D CAD components or assemblies with schedule (schedule-time, 4D) constraint and cost-related information (5D). The use of the term 5D is intended to refer to the addition of 4D: time and 5D: cost to the 3D model (i.e., 5D is 3D+4D+cost).

The construction of the 5D models enables the various participants (e.g., from architects, designers, contractors to owners) of any construction project, to visualize the progress of construction activities and its related costs over time.

Method For Automatic Creation of Bills of Materials

Figure 7:
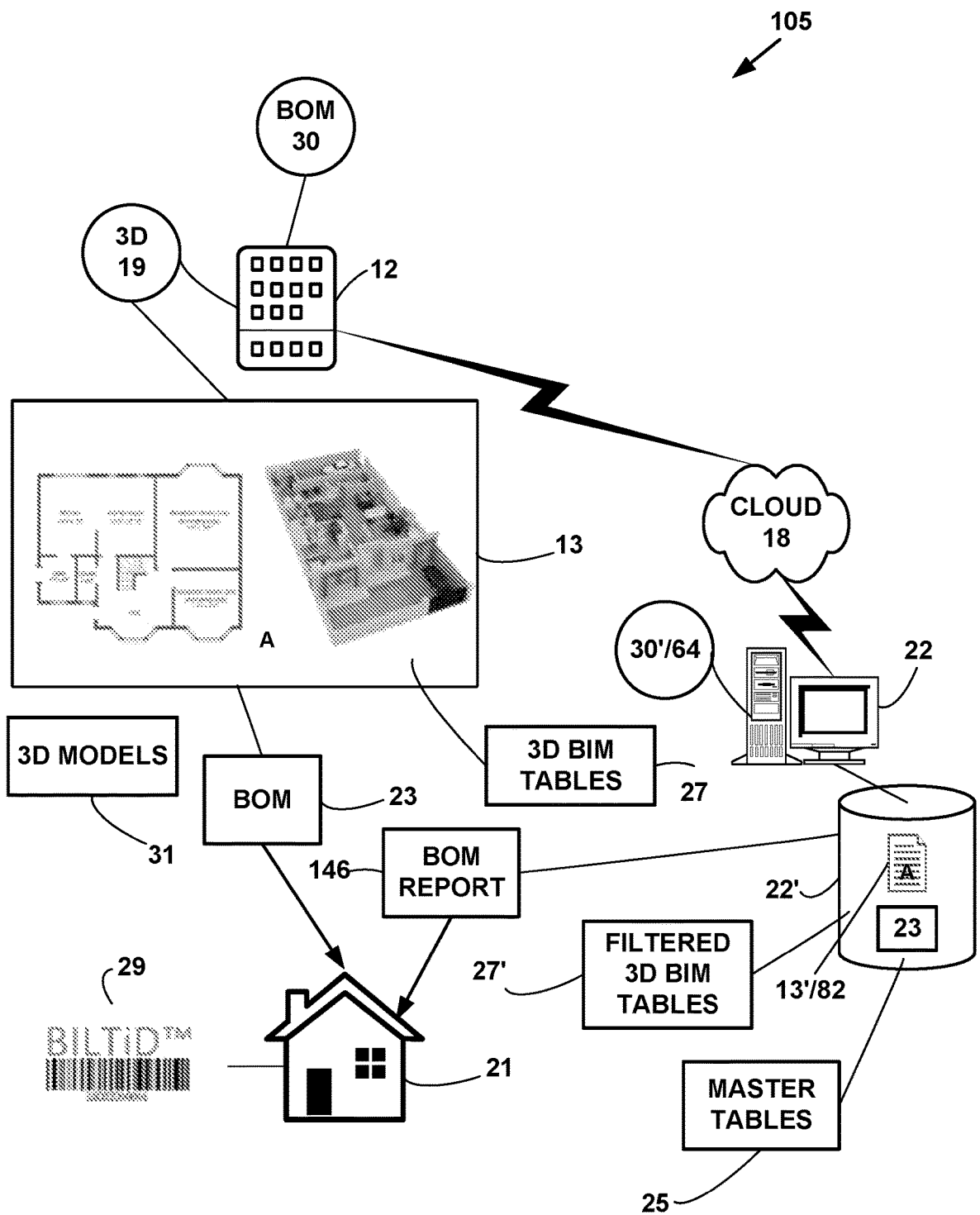
FIG. 7 is a block diagram illustrating a data flow for automatic real-time creation of a Bill of Materials.

FIG. 7 is a block diagram illustrating a data flow 105 for automatic real-time creation of a Bill of Materials.

FIGS. 8A, 8B, 8C and 8D are a flow diagram illustrating a Method 106 for automatic real-time creation of a Bill of Materials.

Figure 8D:
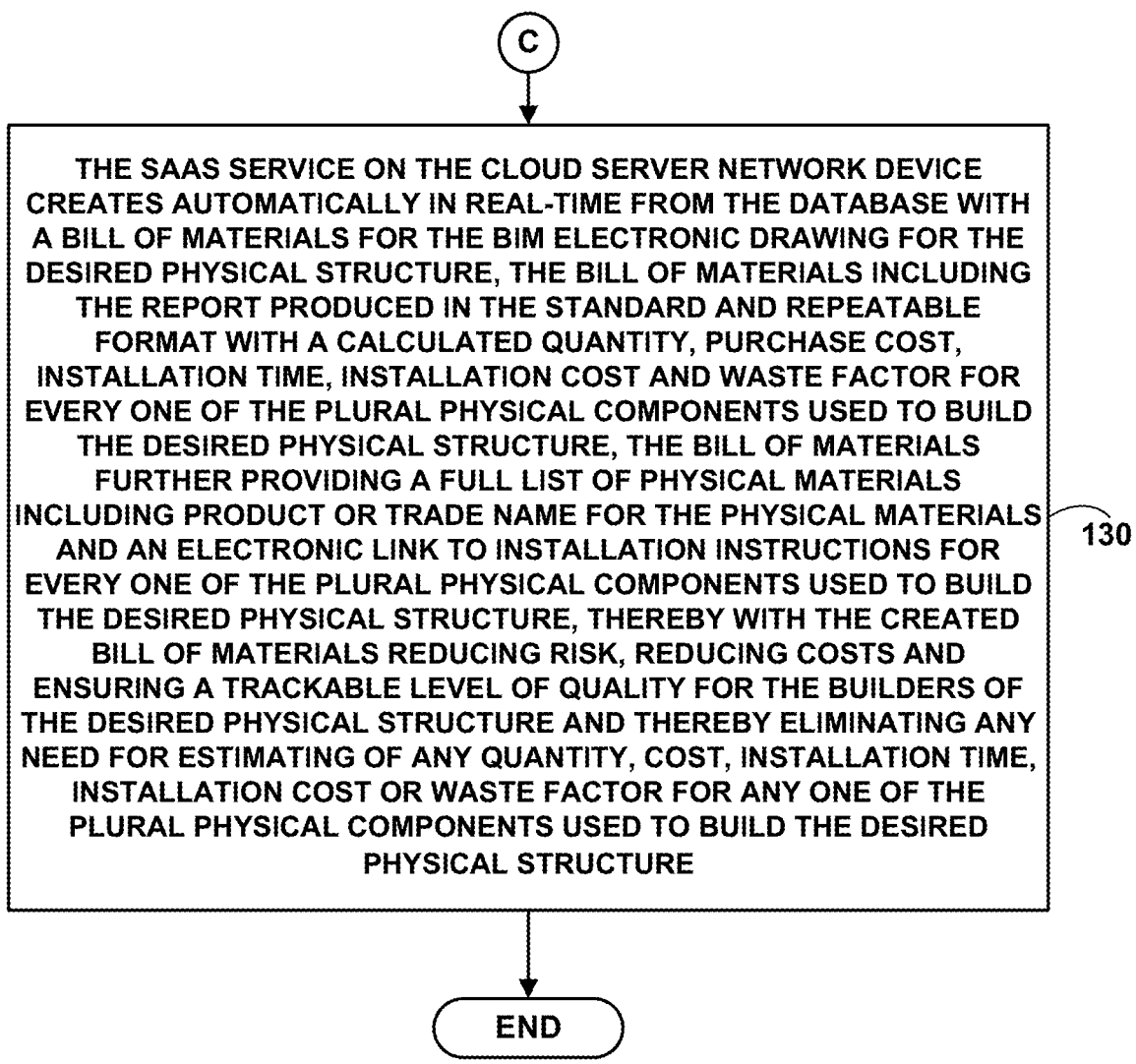

In FIG. 8A at Step 108, a network device with one or more processors creates in a pre-determined layout in a non-transitory computer readable medium, a Building Information Model (BIM) electronic drawing in a three-dimensional (3D) BIM modeling program for a desired physical structure, the BIM electronic drawing created using a Bill of Materials application on the 3D BIM modeling program including a set of Bill of Material guidelines used to automatically create a Bill of Materials including a report produced in a standard and repeatable format and including plural digital representations of every one of plural physical components used to build the desired physical structure including structural components, fastening components, utility components and covering components. At Step 110, a first message from the network device via a cloud communications network to a cloud Software as a Service (SaaS) application on a cloud server network device with one or more processors, to request a Bill of Materials for the BIM electronic drawing for the desired physical structure be automatically created, the first message including an electronic link to the BIM electronic drawing. At Step 112, the first message is received on the SaaS service on the cloud server network device via the cloud communications network from the application on the network device. In FIG. 8B at Step 114, the SaaS service on the cloud server network device creates a new blank database in a pre-determined layout in a non-transitory computer readable medium on the cloud communications network to store digital information for the BIM electronic drawing for the desired physical structure. At Step 116, the SaaS service on the cloud server network device accesses a set of existing plural master tables including plural Bill of Material field identifiers to store digital information from the BIM electronic drawing for the digital representations of every one of the plural physical components used to build the desired physical structure. At Step 118, the SaaS service on the cloud server network device populates the set of the plural master tables with digital information from the link to the BIM electronic drawing from the first message including the digital information from the digital representations of every one of the plural physical components used to build the desired physical structure. At Step 120, the SaaS service on the cloud server network device imports from the link to the BIM electronic drawing from the first message a plural 3D modeling program tables and filters from the 3D modeling program used to create the BIM electronic drawing in the 3D modeling program. In FIG. 8C at Step 122, the SaaS service on the cloud server network device filters the plural 3D modeling program tables to exclude non-essential tables and non-essential information and grouping of filtered plural 3D modeling tables by instance and type of the plural physical components from the BIM electronic drawing. At Step 124, a test is conducted to compare with the SaaS service on the cloud server network device a plural 3D modeling program field identifiers from the imported and filtered 3D modeling program tables with a plural master field identifiers in the plural master tables to determine if a match occurs. If a match occurs at Step 124 at Step 126, the SaaS service on the cloud server network device copies digital information from a matched 3D modeling program table field into a corresponding master table field. At Step 128, the SaaS service on the cloud server network device stores in the database, the set of the plural master tables including the plural Bill of Material field identifiers with digital information populated from the BIM electronic drawing and copied from the imported and filtered 3D modeling program tables. In FIG. 8D at Step 130, the SaaS service on the cloud server network device creates automatically in real-time from the database with a Bill of Materials in a pre-determined layout in the non-transitory computer readable medium for the BIM electronic drawing for the desired physical structure, the Bill of Materials including the report produced in the standard and repeatable format with a calculated quantity, purchase cost, installation time, installation cost and waste factor for every one of the plural physical components used to build the desired physical structure, the Bill of Materials further providing a full list of physical materials including product or trade name for the physical materials and an electronic link to installation instructions for every one of the plural physical components used to build the desired physical structure, thereby with the created Bill of Materials reducing risk, reducing costs and ensuring a trackable level of quality for the builders of the desired physical structure and thereby eliminating any need for estimating of any quantity, cost, installation time, installation cost or waste factor for any one of the plural physical components used to build the desired physical structure.

Method 106 is illustrated with an exemplary embodiment. However, the present invention is not limited to the exemplary embodiment and other embodiment can be used to practice the invention.

In such an exemplary embodiment in FIG. 8A at Step 108, a network device 12, 16, 16, 20, 22, 24, 26 with one or more processors creates in a pre-determined layout in a non-transitory computer readable medium, a Building Information Model (BIM) electronic drawing 13, 15 in a three-dimensional (3D) BIM modeling program 19 for a desired physical structure 21, the BIM electronic drawing 13, 15 created using a Bill of Materials application 30 on the 3D BIM modeling program 19 including a set of Bill of Material guidelines used to automatically create a Bill of Materials 23 including a report 146 produced in a standard and repeatable format and including a plural digital representations of every one of plural physical components used to build the desired physical structure 21 including structural components, fastening components, utility components and covering components.

In one embodiment, the network device is a target network device 12, 14, 16. In another embodiment, the network device is server network device 20, 22, 24, 26.

In one embodiment, the network device is a target network device 12, 14, 16 including a desktop computer, laptop computer, tablet computer, mobile phone, non-mobile phone with display, smart phone, Internet phone, Internet appliance, personal digital/data assistants (PDA), portable game console, non-portable game console, wearable network device, cable television (CATV) set-top box, satellite television (SATV) set-top box, Internet television set-top box and digital televisions including high definition televisions (HDTV) and three-dimensional (3DTV) televisions. However, the present invention is not limited to such an embodiment, and more, fewer and other types of network devices can be used to practice the invention.

In one embodiment, the BIM electronic drawing 13 is created on the network device 12, 14, 16, 20, 22, 24, 26 by architects, structural engineers, Mechanical Electrical Plumbing (MEP) engineers, infrastructure designers, communications utilities designers and/or contractors. However, the present invention is not limited to such an embodiment and more, fewer or other professionals can create the BIM electronic drawing 13 to practice the invention.

In one embodiment the 3D BIM Modeling program 19 includes an AUTODESK REVIT, AUTOCAD, VECTORWORKS, MICROSTATION, ARCHICAD, SOLIDWORKS, TC CREO or SKETCHUP, 3D BIM modeling program. However, the present invention is not limited to such an embodiment and more, fewer or other 3D modeling programs can be used to practice the invention.

In one embodiment, the desired physical structure 21 includes buildings comprising houses, multi-unit housing, apartments, schools, offices, factories, warehouses, restaurants, physical infrastructures, comprising water, wastewater, refuse, electricity, gas, wind, solar, lighting, roads, bridges, ports, tunnels or communication utilities comprising wired and wireless utilities. However, the present invention is not limited to such an embodiment and more, fewer and/or other physical structures can be used to practice the invention.

The SaaS 64 also provides the ability to add items to the Bill of Materials 13 which are not drawn in the BIM modeling program 19, such as fastening components and covering components.

In one embodiment the structural components include, but are not limited to, beams, struts, joists, trusses, walls, floors, roofs, windows, doors, foundation components and/or other structural components. However, the present invention is not limited to such an embodiment and more, fewer or other structural components can be used to practice the invention.

In one embodiment, the fastening components include, but are not limited to, nails, screws, bolts, adhesives, mortar and/or other fastening components. However, the present invention is not limited to such an embodiment and more, fewer or other fastening components can be used to practice the invention.

In one embodiment, the utility components include, but are not limited to, electrical, plumbing, sewage, water, heating, cooling, ventilation, audio, visual, voice, television and/or other utility components. However, the present invention is not limited to such an embodiment and more, fewer or other utility components can be used to practice the invention.

In one embodiment, the covering components include, but are not limited to, paint, stain, wallpaper, carpet, tile and/or other covering components. However, the present invention is not limited to such an embodiment and more, fewer or other covering components can be used to practice the invention.

In the present invention, the Bill of Materials 23 is created down to a resolution of an individual piece level (e.g., stud, board, pipe, duct, etc.) of components used to build the desired physical structure 21. There are no Bill of Materials known in the art that are created down to an individual piece level including individual piece components (e.g., stud, board, pipe, duct, etc.) used to build the desired physical structure 21.

For example, it is determined that every stud is attached in a house with exactly four nails and every piece of dry wall is attached with exactly twelve screws, etc. Therefore, the exact number of nails, screws, etc. can be accurately determined without requiring any counting, any estimations, any waste, etc.

In one embodiment, the Bill of Materials includes four-dimensional (4D) BIM information including 3D BIM information plus time-schedule information and five-dimensional (5D) BIM information including 3D BIM information plus 4D information plus cost information. However, the present invention is not limited to this embodiment and other embodiments can be used to practice the invention.

At Step 110, a first message from the network device (e.g., 12, etc.) via a cloud communications network 18 to a cloud Software as a Service (SaaS) 64 application 30' on a cloud server network device 22 with one or more processors, to request a Bill of Materials 23 for the BIM electronic drawing (e.g., 13, etc.) for the desired physical structure 21 be automatically created, the first message including an electronic link to the BIM electronic drawing 13.

In one embodiment, cloud service network device providing a cloud computing Infrastructure as a Service (IaaS), a cloud Platform as a Service (PaaS) and a cloud Software as a Service (SaaS) including a cloud SaaS service 64 for automatic creation in real-time of a Bill of Materials 21 via the cloud communications network 18.

In another embodiment, the first message includes the BIM electronic drawing 13 instead of a link to it. However, the present invention is not limited to this embodiment.

At Step 112, the first message is received on the SaaS service 64 on the cloud server network device 22 via the cloud communications network 18 from the application 30 on the network device 12.

In FIG. 8B at Step 114, the SaaS service 64 on the cloud server network device 22 creates a new blank database 22' in a pre-determined layout in a non-transitory computer readable medium on the cloud communications network 18 to store digital information for the BIM electronic drawing 13 for the desired physical structure 21.

In one embodiment, the new blank database 22' includes one or more cloud storage objects 82 stored on the cloud communications network 18. However, the present invention is not limited to such an embodiment and other databases and other embodiments can be used to practice the invention.

In one embodiment, the cloud storage objects include plural individual storage fields accessible with REpresentational State Transfer (REST), Simple Object Access Protocol (SOAP), Lightweight Directory Access Protocol (LDAP) or Application Programming Interface (API) protocols. However, the present invention is not limited to such an embodiment and other cloud access protocols and other protocols can be used to practice the invention.

In one embodiment, the new blank database 22' includes a MICROSOFT SQL database, ORACLE database and/or MySQL database. MySQL is an open source database. Such databases are relational databases and include Relational DataBase Management Systems (RDBMS). Such database support ANSI SQL, the standard SQL language.

Structured Query Language (SQL) is a standard computer language for relational database management and data manipulation. SQL is used to query, insert, update and modify data in tables and other database data structures.

At Step 116, the SaaS service 64 on the cloud server network device 22 accesses a set of existing plural of master tables 25 including a plural of Bill of Material field identifiers to store digital information from the BIM electronic drawing 13 for the digital representations the plural physical components used to build the desired physical structure 21.

At Step 118, the SaaS service 64 on the cloud server network device 22 populates the set of the plural master tables 25 with digital information from the link to the BIM electronic drawing 13 from the first message including the digital information from the digital representations of the plural physical components used to build the desired physical structure 21.

At Step 120, the SaaS service 64 on the cloud server network device 22 imports from the link to the BIM electronic drawing 13 from the first message, plural 3D modeling program tables 27 and filters from the 3D modeling program 19 used to create the BIM electronic drawing 13 in the 3D modeling program 19.

In FIG. 8C at Step 122, the SaaS service 64 on the cloud server network device 22 filters the plural 3D modeling program 19 tables 27 to exclude non-essential tables and non-essential information and grouping of filtered plural 3D modeling tables 27' by instance and type of the plural physical components from the BIM electronic drawing 13.

At Step 124, a test is conducted with the SaaS service 64 on the cloud server network device 22 to compare a plural 3D modeling program field identifiers from the imported and filtered 3D modeling program 19 tables 27' with a plural master field identifiers in the plural master tables 25 to determine if a match occurs.

If at Step 124 a match occurs, at Step 126, the SaaS service 64 on the cloud server network device 22 copies digital information from a matched 3D modeling program 19 table 27 field into a corresponding master table 25 field.

At Step 128, the SaaS service 64 on the cloud server network device 22 stores in the database 22' the set of the plural master tables 27 including the plural Bill of Material field identifiers with digital information populated from the BIM electronic drawing 13 and copied from the imported and filtered 3D modeling program tables 25.

In one embodiment, a unique material identifier is associated with each piece in the BIM drawing and is automatically exported from the 3D modeling program (e.g., REVIT, etc.) into the existing plural master tables so that each piece can reference additional material information such as, but not limited to, model, manufacturer, Stock Keeping Unit (SKU) and cost.

In FIG. 8D at Step 130, the SaaS service 64 on the cloud server network device 22 creates automatically in real-time from the database 22' a Bill of Materials 23 in a predetermined layout in the non-transitory computer readable medium for the BIM electronic drawing 13 for the desired physical structure 21, the Bill of Materials 23 including the report 146 produced in the standard and repeatable format with a calculated quantity, purchase cost, installation time, installation cost and waste factor for the plural physical components used to build the desired physical structure 21, the Bill of Materials 23 further providing a full list of physical materials including product or trade name for the physical materials and an electronic link 148 to installation instructions for the plural physical components used to build the desired physical structure 21, thereby with the created Bill of Materials 23 reducing risk, reducing costs and ensuring a trackable level of quality for the builders of the desired physical structure and thereby eliminating any need for estimating of any quantity, cost, installation time, installation cost or waste factor for any one of the plural physical components used to build the desired physical structure 21.

The Bill of Materials standard utilized includes BIM templates comprising annotations, constraints and objects used to draw building structures at a piece level representing material size, shape, location, quantity, and orientation with detailing, fabrication, assembly, and installation information. The quantity, size, shape, location and orientation of each piece is measured automatically from the BIM electronic drawing 13 without referring to annotations.

In one embodiment, the pre-determined layout in the non-transitory computer readable medium for the Bill of Materials 23 includes, but is not limited to, a Family Name 150, Type Name 152, Count 154, Actual Quantity 156, Unit 158, Unit Cost 160, Minimum Order Quantity 162, Quantity to Order 164 and Total Cost 166 portions for the plural physical components used to build the desired physical structure 21. (See, e.g., FIG. 10). However, the present invention is not limited to this embodiment and more, fewer or other items can be used in the pre-determined layout for the Bill of Materials 23 to practice the invention.

In one embodiment, the automatically created Bill of Materials 23 report 146 produced in the standard and repeatable format includes a report creation method (e.g., 106 and 132, etc.) and report format 146 certified by a certifying standards organization to industry-wide standards and requirements to ensure trust, safety, security and sustainability of the standard and repeatable format of the Bill of Materials 23 report 146. In another embodiment, the Bill of Materials 23 report 146 is not certified by any standards organization. However, the present invention is not to limited to such a Bill of Materials report 23 and, other types of reports can be used to practice the invention.

In one embodiment, the Bill of Material 23 report 146 and the methods to create it are certified by a certifying standards organization 170 such as UNDERWRITER LABORATORIES, etc. to ensure trust, safety, security, sustainability and repeatable format of the Bill of Materials 23 report 146. In another embodiment, the Bill of Materials 23 report is not certified by any standards organization. However, the present invention is not limited to such an embodiment and other standards organizations can be used to certify the Bill of Material 23 report and the methods and to practice the invention.

In one embodiment, the automatically created Bill of Materials 23 report includes a unique structure identifier 29 (e.g., DIGIBILT BILTiD identifier, etc.) for the physical structure 21 including a list of the plural physical components used to build the desired physical structure 21, unique features of the desired physical structure, specifications and builders of the desired physical structure, the unique structure Identifier 29 is used to track title registrations, product registrations, recaps, warranty claims, damage claims and insurance coverage associated with the desired physical structure.

In such an embodiment, the structure identifier 29 is similar to a Vehicle Identification Number (VIN) for a vehicle. A vehicle identification number (VIN) is a unique code, including a serial number, used by the automotive industry to identify individual motor vehicles, towed vehicles, motorcycles, scooters and mopeds, as defined in ISO 3779 (content and structure) and ISO 4030 (location and attachments).

In such an embodiment, like a VIN for a vehicle the structure identifier 29 is interpreted to determine all the unique features of the physical structure 21. However, the present invention is not limited to such and embodiment, and more, fewer and/or other information can be used with the structure identifier 29 to practice the invention.

In one embodiment, the structure identifier 29 is not created and not assigned to the physical structure 21 until the physical structure 21 is complete. In another embodiment, the structure identifier 29 is not created and not assigned to the physical structure 21 until the physical structure 21 is complete and sold to a new party or title transferred to a new party.

In one embodiment, the structure identifier 29 includes a bar code identifier. A "barcode" is an optical machine-readable representation of data, which shows data about the object to which it attaches. Originally, barcodes represented data by varying the widths and spacing of parallel lines, and may be referred to as linear or 1 dimensional (1D). Later they evolved into rectangles, dots, hexagons and other geometric patterns in 2 dimensions (2D). Although 2D systems use a variety of symbols, they are generally referred to as barcodes as well. Barcodes originally were scanned by special-optical scanners called barcode readers, scanners and interpretive software are available on devices including desktop printers (not illustrated) and smart phones 14 and tablet computers 12. In specific embodiment, the bar code is a QR Code. A "QR Code" is a specific matrix barcode (or two-dimensional code), readable by dedicated QR barcode readers and camera phones. The code consists of black modules arranged in a square pattern on a white background. The information encoded can be text, URL or other data. QR codes are defined in ISO/IEC 18004:2006 *Information technology—Automatic identification and data capture techniques—QR Code* 2005 bar code symbology specification, 1 Sep. 2006, the contents of which are incorporated by reference.

In one embodiment, Method 106 includes the additional step of displaying on a display component 34 on the network device 12 from the SaaS service 64 on the cloud server network device 22 via the cloud communications network 18 the automatically created Bill of Materials 23. However, the present invention is not limited to this embodiment and the invention can be practice with and/or without this additional step.

In one embodiment, Method 106 includes the additional step of sending the automatically created Bill of Materials 21 from the SaaS service 64 on the cloud server network device 22 to the network device 12 via the cloud communications network 18. However, the present invention is not limited to this embodiment and the invention can be practice with and/or without this additional step.

In another embodiment, Method 106 includes the additional step of creating the BIM electronic drawing 13 on the network device 12 directly with the SaaS service 64 on the cloud server network device 22 via the cloud communications network 18. The SaaS service 64 provides access to the 3D modeling program 19 for creation of the BIM electronic drawing 13. However, the present invention is not limited to this embodiment and the invention can be practice with and/or without this additional step.

In another embodiment, Method 106 includes the additional steps of selecting on the network device 12 a desired 3D project model from a set of plural of existing 3D project models 31 and creating a project model BIM electronic drawing 13 using the Bill of Materials application 30 on the 3D BIM modeling program 19. In one embodiment, the set of the plural existing 3D project models 31 includes plural different existing 3D project models for single family homes, townhouses and multi-unit and commercial structures.

For example, the plural existing 3D project models 31 may include house plans for houses of a desired size, including Craftsman bungalows tiny in-law suites, with open floor plans, porches, and flexible living spaces, etc. and/or house plans designed by a specific architect and used over and over in a sub-division, etc. However, the present invention is not limited to such an embodiment, and more, fewer or other types of existing 3D project models may be used to practice the invention.

FIG. 9 is a flow diagram illustrating a Method 132 for automatic real-time creation of a Bill of Materials. At Step 134, the BIM electronic drawing is updated via the 3D BIM modeling program on the network device for the desired physical structure. At Step 136, a second message is sent from the network device to the SaaS service on the cloud server network device via the cloud communications network to create an updated Bill of Materials from the updated BIM electronic drawing, the second message including a second electronic link to the updated BIM electronic drawing. At Step 138, the database is update via the SaaS service on the cloud server network device with updated information collected from the updated BIM electronic drawing. At Step 140, the SaaS service on the cloud server network device creates in real-time from the database on the updated Bill of Materials for the updated BIM electronic drawing. At Step 142, the updated Bill of Materials is send from the SaaS service on the cloud server network device to the network device via the cloud communications network.

Method 132 is illustrated with an exemplary embodiment. However, the present invention is not limited to the exemplary embodiment and other embodiment can be used to practice the invention.

At Step 134, the BIM electronic drawing 13 is updated 13' via the 3D BIM modeling program 19 on the network device 12 for the desired physical structure 21.

At Step 136, a second message is sent from the network device 12 to the SaaS service 64 on the cloud server network device 22 via the cloud communications network 18 to create an updated Bill of Materials 23' from the updated BIM electronic drawing 13', the second message including a second electronic link to the updated BIM electronic drawing 13'.

At Step 138, the database 22' is update via the SaaS service 42 on the cloud server network device 22 with updated information collected from the updated BIM electronic drawing 13'.

At Step 140, the SaaS service 64 on the cloud server network device 22 creates in real-time from the database 22' on the updated Bill of Materials 23' for the updated BIM electronic drawing 13'.

At Step 142, the updated Bill of Materials 23' is send from the SaaS service 64 on the cloud server network device 22' to the network device 12 via the cloud communications network 18.

Figure 10:
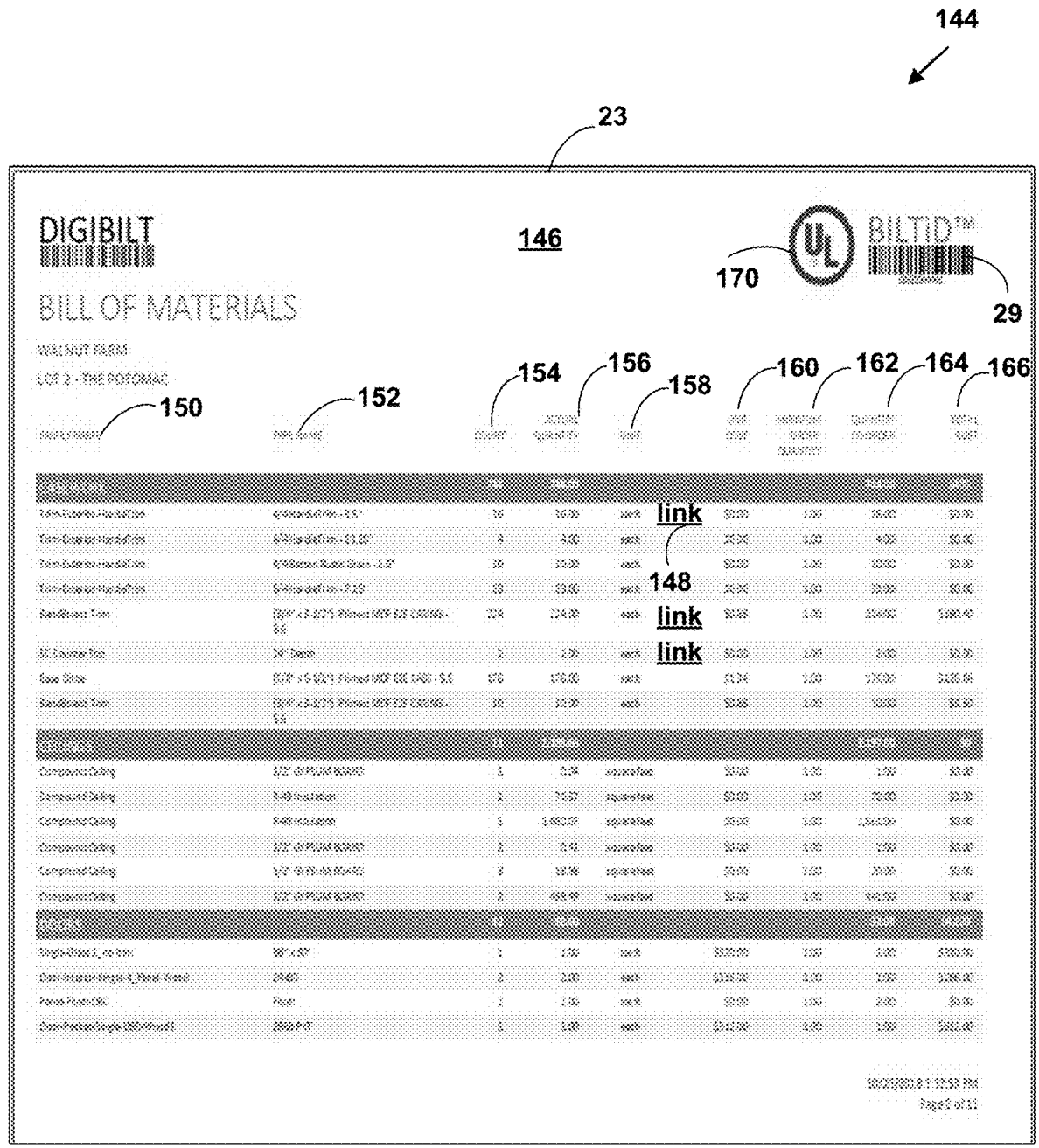
FIG. 10 is a block diagram illustrating an exemplary Bill of Materials standard report.

FIG. 10 is a block diagram 144 illustrating an exemplary Bill of Materials 23 standard report 146.

The Bill of Materials 23 standard report 146 is created with Method 106 and updated with Method 132. The report 146 is produced in the standard and repeatable format with a calculated quantity, purchase cost, installation time, installation cost and waste factor for the plural physical components used to build the desired physical structure 21, the Bill of Materials 23 further providing a full list of physical materials including product or trade name for the physical materials and an electronic link to installation instructions for the plural physical components used to build the desired physical structure 21, thereby with the created Bill of Materials 23 report 146 reducing risk, reducing costs and ensuring a trackable level of quality for the builders of the desired physical structure and thereby eliminating any need for estimating of any quantity, cost, installation time, installation cost or waste factor for any one of the plural physical components used to build the desired physical structure 21.

A method and system for automatically creating Bills of Materials is presented herein. A Building Information Model (BIM) electronic drawing is created on a 3D BIM program using Bill of Material standards. The BIM electronic drawing is exported, filtered and stored into a database with a cloud Software as a Service (SaaS) service on a cloud communications network The data is analyzed to produce in real-time a Bill of Materials accurate down to an individual piece level (stud, board, pipe, duct, etc.) for desired physical structures (e.g., houses, townhomes, multi-unit housing, etc.). The Bill of Materials includes a report produced in a standard and repeatable format with a calculated quantity, purchase cost, installation time, installation cost and waste factor for the plural physical components used to build the desired physical structure, thereby reducing risk, reducing costs and ensuring a trackable level of quality for the builders of the desired physical structure and thereby eliminating any need for estimating of any quantity, cost, installation time, installation cost or waste factor for any one of the plural physical components used to build the desired physical structure.

It should be understood that the architecture, programs, processes, methods and systems described herein are not related or limited to any particular type of computer or network system (hardware or software), unless indicated otherwise. Various types of computing systems may be used with or perform operations in accordance with the teachings described herein.

In view of the wide variety of embodiments to which the principles of the present invention can be applied, it should be understood that the illustrated embodiments are exemplary only, and should not be taken as limiting the scope of the present invention. For example, the steps of the flow diagrams may be taken in sequences other than those described, and more or fewer elements may be used in the block diagrams.

While various elements of the preferred embodiments have been described as being implemented in software, in other embodiments hardware or firmware implementations may alternatively be used, and vice-versa.

The claims should not be read as limited to the described order or elements unless stated to that effect. In addition, use of the term "means" in any claim is intended to invoke 35 U.S.C. § 112, paragraph 6, and any claim without the word "means" is not so intended. Therefore, all embodiments that come within the scope and spirit of the following claims and equivalents thereto are claimed as the invention.

We claim:

1. A method for automatically creating a bill of materials, comprising:

creating, on a network device with one or more processors in a pre-determined layout in a non-transitory computer readable medium, a Building Information Model (BIM) electronic drawing in a three-dimensional (3D) BIM modeling program for a desired physical structure, the BIM electronic drawing created using a Bill of Materials application on the 3D BIM modeling program including a set of Bill of Material guidelines used to automatically create a Bill of Materials including a report produced in a standard and repeatable format and including a plurality of digital representations of a plurality of physical components used to build the desired physical structure including structural components, fastening components, utility components and covering components;

sending a first message from the network device via a cloud communications network to a cloud Software as a Service (SaaS) application on a cloud server network device with one or more processors, to request a Bill of Materials for the BIM electronic drawing for the desired physical structure be automatically created, the first message including an electronic link to the BIM electronic drawing;

receiving the first message on the SaaS service on the cloud server network device via the cloud communications network from the application on the network device;

creating with the SaaS service on the cloud server network device a new blank database in a pre-determined layout in a non-transitory computer readable medium on the cloud communications network to store digital information for the BIM electronic drawing for the desired physical structure;

accessing with the SaaS service on the cloud server network device an existing set of a plurality of master tables including a plurality of Bill of Material field identifiers to store digital information from the BIM electronic drawing for the digital representations of the plurality of physical components used to build the desired physical structure;

populating with the SaaS service on the cloud server network device the set of the plurality of master tables with digital information from the link to the BIM electronic drawing from the first message including the digital information from the digital representations of the plurality of physical components used to build the desired physical structure;

importing with the SaaS service on the cloud server network device from the link to the BIM electronic drawing from the first message a plurality of 3D modeling program tables and filters from the 3D modeling program used to create the BIM electronic drawing in the 3D modeling program;

filtering with the SaaS service on the cloud server network device the plurality of 3D modeling program tables to exclude non-essential tables and non-essential information and grouping of filtered plurality of 3D modeling tables by instance and type of the plurality of physical components from the BIM electronic drawing;

comparing with the SaaS service on the cloud server network device a plurality of 3D modeling program field identifiers from the imported and filtered 3D modeling program tables with a plurality of master field identifiers in the plurality of master tables until no matches occur;

copying with the SaaS service on the cloud server network device digital information from a matched 3D modeling program table field into a corresponding master table field;

storing in the database with the SaaS service on the cloud server network device the set of the plurality of master tables including the plurality of Bill of Material field identifiers with digital information populated from the BIM electronic drawing and copied from the imported and filtered 3D modeling program tables;

adding to the stored set of the plurality of master tables including the plurality of Bill of Material field identifiers with digital information populated from the BIM electronic drawing and copied from the imported and filtered 3D modeling program tables a plurality of additional physical components used to build the desired physical structure that cannot be drawn in the 3D modeling program including fastening components and covering components;

calculating a quantity, purchase cost, installation time, installation cost and waste factor for the plurality of additional physical components used to build the desired physical structure that cannot be drawn in the 3D modeling program for the Bill of Materials including the fastening components and covering components;

creating automatically in real-time from the database with the SaaS service on the cloud server network device in the non-transitory computer readable medium, the Bill of Materials for the BIM electronic drawing for the desired physical structure, the Bill of Materials including the report produced in the standard and repeatable format with the calculated quantity, purchase cost, installation time, installation cost and waste factor for the other plurality of physical components used to build the desired physical structure that are drawn in the 3D modeling program;

adding to the created Bill of Materials a full list of physical materials including product or trade name for the physical materials and an electronic link to installation instructions for the plurality of physical components used to build the desired physical structure, providing the automatically created Bill of Materials from the SaaS service on the cloud server network device to the network device via the cloud communications network in the 3D modeling program, thereby the automatically created Bill of Materials reducing risk, reducing costs and ensuring a trackable level of quality for the builders of the desired physical structure, and thereby eliminating any need for manual estimating of any quantity, cost, installation time, installation cost and waste factor for any one of the plurality of physical components used to build the desired physical structure including those physical components that cannot be drawn in the 3D modeling program.

2. The method of claim 1 further comprising:
displaying on a display component on the network device from the SaaS service on the cloud server network device via the cloud communications network the automatically created Bill of Materials; and
sending the automatically created Bill of Materials from the SaaS service on the cloud server network device to the network device via the cloud communications network.

3. The method of claim 1 further comprising:
creating the BIM electronic drawing on the network device directly with the SaaS service on the cloud server network device via the cloud communications network, wherein the SaaS service provides access to the 3D modeling program for creation of the BIM electronic drawing.

4. The method of claim 1 wherein the 3D BIM modeling program includes a AUTODESK REVIT, AUTOCAD, VECTORWORKS, MICROSTATION, ARCHICAD, SOLIDWORKS, TC CREO or SKETCHUP, 3D BIM modeling program.

5. The method of claim 1 wherein, the network device includes a desktop computer, laptop computer, tablet computer, mobile phone, non-mobile phone with display, smart phone, Internet phone, Internet appliance, personal digital/data assistants (PDA), portable game console, non-portable game console, wearable network device, cable television (CATV) set-top box, satellite television (SATV) set-top box, Internet television set-top box and digital televisions including high definition televisions (HDTV) and three-dimensional (3DTV) televisions.

6. The method of claim 1 wherein the cloud service network device providing a cloud computing Infrastructure as a Service (IaaS), a cloud Platform as a Service (PaaS) and a cloud Software as a Service (SaaS) including a cloud SaaS service for automatic creation in real-time of a Bill of Materials via the cloud communications network.

7. The method of claim 1 wherein the pre-determined layout in the non-transitory computer readable medium for the Bill of Materials includes: a Family Name, Type Name, Count, Actual Quantity, Unit, Unit Cost, Minimum Order Quantity, Quantity to Order and Total Cost, portions for each of the plural physical components used to build the desired physical structure.

8. The method of claim 1 wherein the Bill of Materials includes BIM templates comprising annotations, constraints and objects used to draw building structures at a piece level representing material size, shape, location, quantity and orientation with detailing, fabrication, assembly, and installation information, wherein quantity, size, shape, location and orientation of each piece is measured automatically from the BIM electronic drawing without referring to annotations.

9. The method of claim 1 wherein the database on the cloud server network device includes one or more cloud storage objects with a plurality of individual storage fields accessible with REpresentational State Transfer (REST), Simple Object Access Protocol (SOAP), Lightweight Directory Access Protocol (LDAP) or Application Programming Interface (API) protocols and wherein the database on the cloud server network device includes a Structural Query Language (SQL) Relational DataBase Management System (RDBMS) database.

10. The method of claim 1 wherein the SaaS provides the ability to add items to the Bill of Materials which are not drawn in the BIM modeling program including fastening components and covering components for the desired physical structure.

11. The method of claim 1 wherein the automatically created Bill of Materials report produced in the standard and repeatable format includes a report creation method and report format certified by a certifying standards organization to industry-wide standards and requirements to ensure trust, safety, security and sustainability of the standard and repeatable format of the Bill of Materials report.

12. The method of claim 1 wherein the automatically created Bill of Materials report includes a unique structure identifier for the physical structure including a list of the plurality of physical components used to build the desired physical structure, unique features of the desired physical structure, specifications and builders of the desired physical structure, the unique structure identifier used to track title registrations, product registrations, recalls, warranty claims, damage claims and insurance coverage associated with the desired physical structure, wherein the structure identifier is a bar code identifier.

13. The method of claim 12 wherein the structure identifier is a bar code identifier.

14. The method of claim 1 wherein the desired physical structure includes buildings comprising houses, multi-unit housing, apartments, schools, offices, factories, restaurants, warehouses, physical infrastructures, comprising water, wastewater, refuse, electricity, gas, wind, solar, lighting, roads, bridges, ports, tunnels or communication utilities comprising wired and wireless utilities.

15. The method of claim 1 wherein the BIM electronic drawing is created on the network device by architects, structural engineers, Mechanical Electrical Plumbing (MEP) engineers, infrastructure designers, communications utilities designers or contractors.

16. The method of claim 15 wherein the set of the plurality of existing 3D project models includes a plurality of different existing 3D project models for single family homes, townhouses and multi-unit housing.

17. The method of claim 1 further comprising:
updating the BIM electronic drawing via the 3D BIM modeling program on the network device for the desired physical structure;
sending a second message from the network device to the SaaS service on the cloud server network device via the cloud communications network to create an updated Bill of Materials from the updated BIM electronic drawing, the second message including a second electronic link to the updated BIM electronic drawing;
updating the database via the SaaS service on the cloud server network device with updated information collected from the updated BIM electronic drawing;
creating in real-time from the database on the SaaS service on the cloud server network device the updated Bill of Materials for the updated BIM electronic drawing; and sending the updated Bill of Materials from the service on the cloud server network device to the network device via the cloud communications network.

18. The method of claim 1 further comprising:
selecting on the network device a desired 3D project model from a set of a plurality of existing 3D project models; and
creating a project model BIM electronic drawing using the Bill of Materials application on the 3D BIM modeling program.

19. A non-transitory computer readable medium have stored therein a plurality of instructions for causing one or more processors on one or more network devices to execute the steps comprising:
creating, on a network device with one or more processors in a pre-determined layout in a non-transitory computer readable medium, a Building Information Model (BIM) electronic drawing in a three-dimensional (3D) BIM modeling program for a desired physical structure, the BIM electronic drawing created using a Bill of Materials application on the 3D BIM modeling program including a set of Bill of Material guidelines used to automatically create a Bill of Materials including a report produced in a standard and repeatable format and including a plurality of digital representations of a plurality of physical components used to build the desired physical structure including structural components, fastening components, utility components and covering components;
sending a first message from the network device via a cloud communications network to a cloud Software as a Service (SaaS) application on a cloud server network device with one or more processors, to request a Bill of Materials for the BIM electronic drawing for the desired physical structure be automatically created, the first message including an electronic link to the BIM electronic drawing;
receiving the first message on the SaaS service on the cloud server network device via the cloud communications network from the application on the network device;
creating with the SaaS service on the cloud server network device a new blank database in a pre-determined layout in a non-transitory computer readable medium on the cloud communications network to store digital information for the BIM electronic drawing for the desired physical structure;
accessing with the SaaS service on the cloud server network device an existing set of a plurality of master tables including a plurality of Bill of Material field identifiers to store digital information from the BIM electronic drawing for the digital representations of the plurality of physical components used to build the desired physical structure;
populating with the SaaS service on the cloud server network device the set of the plurality of master tables with digital information from the link to the BIM electronic drawing from the first message including the digital information from the digital representations of the plurality of physical components used to build the desired physical structure;
importing with the SaaS service on the cloud server network device from the link to the BIM electronic drawing from the first message a plurality of 3D modeling program tables and filters from the 3D modeling program used to create the BIM electronic drawing in the 3D modeling program;
filtering with the SaaS service on the cloud server network device the plurality of 3D modeling program tables to exclude non-essential tables and non-essential information and grouping of filtered plurality of 3D modeling tables by instance and type of the plurality of physical components from the BIM electronic drawing;
comparing with the SaaS service on the cloud server network device a plurality of 3D modeling program field identifiers from the imported and filtered 3D modeling program tables with a plurality of master field identifiers in the plurality of master tables until no matches occur;
copying with the SaaS service on the cloud server network device digital information from a matched 3D modeling program table field into a corresponding master table field;
storing in the database with the SaaS service on the cloud server network device the set of the plurality of master tables including the plurality of Bill of Material field identifiers with digital information populated from the BIM electronic drawing and copied from the imported and filtered 3D modeling program tables;
adding to the stored set of the plurality of master tables including the plurality of Bill of Material field identifiers with digital information populated from the BIM electronic drawing and copied from the imported and filtered 3D modeling program tables a plurality of additional physical components used to build the desired physical structure that cannot be drawn in the 3D modeling program including fastening components and covering components;
calculating a quantity, purchase cost, installation time, installation cost and waste factor for the plurality of additional physical components used to build the desired physical structure that cannot be drawn in the 3D modeling program for the Bill of Materials including the fastening components and covering components;
creating automatically in real-time from the database with the SaaS service on the cloud server network device in the non-transitory computer readable medium, the Bill of Materials for the BIM electronic drawing for the desired physical structure, the Bill of Materials including the report produced in the standard and repeatable format with the calculated quantity, purchase cost, installation time, installation cost and waste factor for the other plurality of physical components used to build the desired physical structure that are drawn in the 3D modeling program;
adding to the created Bill of Materials a full list of physical materials including product or trade name for the physical materials and an electronic link to installation instructions for the plurality of physical components used to build the desired physical structure,
providing the automatically created Bill of Materials from the SaaS service on the cloud server network device to the network device via the cloud communications network in the 3D modeling program,
thereby the automatically created Bill of Materials reducing risk, reducing costs and ensuring a trackable level of quality for the builders of the desired physical structure, and
thereby eliminating any need for manual estimating of any quantity, cost, installation time, installation cost and waste factor for any one of the plurality of physical components used to build the desired physical structure including those physical components that cannot be drawn in the 3D modeling program.

20. A system for automatically creating a bill of materials, comprising in combination;

a cloud communications network;

a cloud server network device with one or more processors providing a cloud computing Infrastructure as a Service (IaaS), a cloud Platform as a Service (PaaS) and a cloud Software as a Service (SaaS) including a cloud SaaS service for automatic creation in real-time of a Bill of Materials via the cloud communications network;

a network device with one or more processors and a non-transitory computer readable medium;

for creating, on a network device with one or more processors in a pre-determined layout in a non-transitory computer readable medium, a Building Information Model (BIM) electronic drawing in a three-dimensional (3D) BIM modeling program for a desired physical structure, the BIM electronic drawing created using a Bill of Materials application on the 3D BIM modeling program including a set of Bill of Material guidelines used to automatically create a Bill of Materials including a report produced in a standard and repeatable format and including a plurality of digital representations of a plurality of physical components used to build the desired physical structure including structural components, fastening components, utility components and covering components;

for sending a first message from the network device via a cloud communications network to a cloud Software as a Service (SaaS) application on a cloud server network device with one or more processors, to request a Bill of Materials for the BIM electronic drawing for the desired physical structure be automatically created, the first message including an electronic link to the BIM electronic drawing;

for receiving the first message on the SaaS service on the cloud server network device via the cloud communications network from the application on the network device;

for creating with the SaaS service on the cloud server network device a new blank database in a pre-determined layout in a non-transitory computer readable medium on the cloud communications network to store digital information for the BIM electronic drawing for the desired physical structure;

for accessing with the SaaS service on the cloud server network device an existing set of a plurality of master tables including a plurality of Bill of Material field identifiers to store digital information from the BIM electronic drawing for the digital representations of the plurality of physical components used to build the desired physical structure;

for populating with the SaaS service on the cloud server network device the set of the plurality of master tables with digital information from the link to the BIM electronic drawing from the first message including the digital information from the digital representations of the plurality of physical components used to build the desired physical structure;

for importing with the SaaS service on the cloud server network device from the link to the BIM electronic drawing from the first message a plurality of 3D modeling program tables and filters from the 3D modeling program used to create the BIM electronic drawing in the 3D modeling program;

for filtering with the SaaS service on the cloud server network device the plurality of 3D modeling program tables to exclude non-essential tables and non-essential information and grouping of filtered plurality of 3D modeling tables by instance and type of the plurality of physical components from the BIM electronic drawing;

for comparing with the SaaS service on the cloud server network device a plurality of 3D modeling program field identifiers from the imported and filtered 3D modeling program tables with a plurality of master field identifiers in the plurality of master tables until no matches occur;

for copying with the SaaS service on the cloud server network device digital information from a matched 3D modeling program table field into a corresponding master table field;

for storing in the database with the SaaS service on the cloud server network device the set of the plurality of master tables including the plurality of Bill of Material field identifiers with digital information populated from the BIM electronic drawing and copied from the imported and filtered 3D modeling program tables;

for adding to the stored set of the plurality of master tables including the plurality of Bill of Material field identifiers with digital information populated from the BIM electronic drawing and copied from the imported and filtered 3D modeling program tables a plurality of additional physical components used to build the desired physical structure that cannot be drawn in the 3D modeling program including fastening components and covering components;

for calculating a quantity, purchase cost, installation time, installation cost and waste factor for the plurality of additional physical components used to build the desired physical structure that cannot be drawn in the 3D modeling program for the Bill of Materials including the fastening components and covering components;

for creating automatically in real-time from the database with the SaaS service on the cloud server network device in the non-transitory computer readable medium, the Bill of Materials for the BIM electronic drawing for the desired physical structure, the Bill of Materials including the report produced in the standard and repeatable format with the calculated quantity, purchase cost, installation time, installation cost and waste factor for the other plurality of physical components used to build the desired physical structure that are drawn in the 3D modeling program;

for adding to the created Bill of Materials a full list of physical materials including product or trade name for the physical materials and an electronic link to installation instructions for the plurality of physical components used to build the desired physical structure, for providing the automatically created Bill of Materials from the SaaS service on the cloud server network device to the network device via the cloud communications network in the 3D modeling program, thereby the automatically created Bill of Materials reducing risk, reducing costs and ensuring a trackable level of quality for the builders of the desired physical structure, and thereby eliminating any need for manual estimating of any quantity, cost, installation time, installation cost and waste factor for any one of the plurality of physical components used to build the desired physical structure including those physical components that cannot be drawn in the 3D modeling program.

* * * * *